(12) United States Patent
Kobori

(10) Patent No.: US 6,327,554 B1
(45) Date of Patent: Dec. 4, 2001

(54) SIMULATION METHOD AND SYSTEM FOR ORGANIC ELECTROLUMINESCENT DEVICE, AND ELECTROLUMINESCENT DEVICE

(75) Inventor: Isamu Kobori, Ibaraki (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/210,797

(22) Filed: Dec. 15, 1998

(30) Foreign Application Priority Data

Dec. 15, 1997 (JP) .................................... 9-363196

(51) Int. Cl.$^7$ ............................. G06G 7/48; G06G 7/56; G06F 7/60; G02B 1/01; G02F 1/03

(52) U.S. Cl. .................. 703/5; 703/2; 703/4; 703/12; 359/584; 359/244

(58) Field of Search ................................ 703/2, 4, 5, 12; 359/244, 584

(56) References Cited

U.S. PATENT DOCUMENTS

| | | | |
|---|---|---|---|
| 3,765,773 | * | 10/1973 | Weiner ................................... 356/364 |
| 4,220,395 | * | 9/1980 | Wang et al. ............................ 385/11 |
| 5,408,881 | * | 4/1995 | Piche et al. ............................ 73/582 |
| 5,514,499 | * | 5/1996 | Iwamatsu et al. ....................... 430/5 |
| 5,777,793 | * | 7/1998 | Little et al. ............................. 359/584 |
| 5,891,554 | * | 4/1999 | Hosokawa et al. ................... 428/212 |
| 5,943,154 | * | 8/1999 | Nakayama ............................ 359/244 |

FOREIGN PATENT DOCUMENTS

| | | |
|---|---|---|
| 4-328295 | 11/1992 | (JP) . |
| 7-240277 | 9/1995 | (JP) . |

OTHER PUBLICATIONS

Fujii et al.; "Anisotropic optical properties of an organic electroluminescent diode with a periodic multilayer structure"; Thin Film Solids; pp. 199–201, Feb. 1996.*

Tsutsui et al.; "Revisit on the role of oxadiazole hole blocking layer in organic multilayer electroluminescent devices"; Synthetic Metals; pp. 1201–1204, Mar. 1997.*

Jaing et al.; "Multilayer organic light–emitting devices"; Solid State Comm.; Jul. 1996.*

Haus, "Waves and fields in optoelectronics" (chapter 2); Prentice–Hall, 1984.*

Kong; "Theory of electromagnetic waves" (chapter 4); John Wiley & Sons, 1974.*

* cited by examiner

Primary Examiner—Kevin J. Teska
Assistant Examiner—Hugh Jones
(74) Attorney, Agent, or Firm—Oblon, Spivak, McClelland, Maier & Neustadt, P.C.

(57) ABSTRACT

A simple mathematical model, given below, is constructed on the premise that reflected light other than light reflected at a metal surface is quantitatively taken into consideration the device to which the present invention is applied is a multilayer structure with a refractive index difference, so that only one reflection at an interface other than the metal surface can be taken into account that is, two or more reflections can be neglected. Further the concept of localized light emitting surfaces is extended to a non-localized model. The below simple mathematical model is used to treat reflected wave components so that an accurate simulation can be run.

$$\Phi[\lambda] = \Phi_1 + \sum_{t=1}^{p-1} \Phi_{t,t+1} + \sum_{t=1}^{q-1} \Phi_{t,t+1} + \sum_{t=1}^{q} \Phi_{t,t-1}$$

6 Claims, 11 Drawing Sheets

WAVELENGTH (nm)

ITO= 75nm

ITO= 100nm

SIMULATION METHOD AND SYSTEM FOR ORGANIC ELECTROLUMINESCENT DEVICE, AND ELECTROLUMINESCENT DEVICE

BACKGROUND OF THE INVENTION

1. Field of the Invention

The present invention relates generally to an organic EL (electroluminescent) device using an organic compound. More specifically, this invention is concerned with a simulation method and system for providing an organic EL device that enable the light emitted therefrom to be effectively available with a reduced emission luminance variation, and an organic EL device as well.

2. Discussion of the Background

In recent years, organic EL devices have been under intensive investigation. One such device is basically built up of a thin film form of hole transporting material such as triphenyldiamine (TPD) deposited by evaporation on a hole injecting electrode, a light emitting layer of fluorescent material such as an aluminum quinolinol complex ($Alq^3$) laminated thereon, and a metal (electron injecting) electrode of a metal having a low work function such as Mg and formed on the light emitting layer. This organic EL device now attracts attention because a very high luminance ranging from several hundred to tens of thousand $cd/m^2$ can be achieved with a voltage of approximately 10 V.

The organic EL device has a basic arrangement including on a substrate a film form of organic EL structure comprising an electron injecting electrode, an organic layer, a hole injecting electrode, etc., as mentioned just above. Usually, the light emitted from the device is taken out of the substrate side via the hole injecting electrode.

Regarding an organic EL device in general, it is known that emission spectra of light emitting species are modulated by optical interference in the device, upon which they leave the device. For this reason, even when an organic EL device comprising the same light emitting material is applied to a different optical system, there are changes in the spectra emitted out of the device, and their intensity.

The greatest optical modulation is known to occur by interference between forwardly emitted light and light emitted backwardly and reflected at a metal surface (electron infecting electrode), as set forth in JP-A 4-328295. This effect is expressed in terms of a function determined by a distance between a light emitting point and the metal surface, and so an optical arrangement for obtaining the desired modulated spectra can be known therefrom. However, this is still less than satisfactory for making much more precise estimations, for the reason of large errors. In other words, another parameter for consideration is required.

In this regard, JP-A 7-240277 reveals another problem, i.e., the modulation of light emitted out of an organic EL device due to interference of light reflected at an interface between glass and a transparent electrode. However, the publication merely states that to increase the intensity of emitted light of a specific wavelength in a narrow range by making use of optical modulation, it is only required to regulate an optical thickness between the glass/transparent conductive film interface and a metal surface with an organic multilayer structure interleaved between them to a specific value.

Here assume a certain optical system. Then, it would be difficult to make any detailed study of spectral modulation without expectation of to what degree the spectra are modulated by interference caused by a parameter other than the aforesaid one. This would in turn make the optical design of an optimized device difficult. In the prior art, the influence of a more sophisticated arrangement, for instance, an arrangement comprising many reflective interfaces in addition to the interface between the organic multilayer structure and the transparent conductive film is not taken into account. Nor is the utilization of such an arrangement investigated.

SUMMARY OF THE INVENTION

As mentioned above, the changes in the thickness of films forming an organic EL device give rise to changes in the spectra and luminance of light emitted out of the device. In order to use this device with a display device, it is desired that characteristic variations ascribable to them be reduced as much as possible. Never until now, however, is any argument adduced about to what degree the optical thickness is controlled. It is thus still difficult to reduce such variations and, hence, provide consistent products.

An object of the invention is to provide a simulation method and system for simulating an organic EL device, which, by making approximations to reflected light components other than reflected light with consideration given so far thereto, can make an accurate estimation of spectra emitted out of an organic EL device having a general and arbitrary structure, thereby enabling a device design for obtaining the desired spectra.

Another object of the invention is to provide a simulation method and system for simulating an organic EL device, which enables light to be effectively taken out of even a structure comprising many reflective surfaces.

Yet another object of the invention is to provide a simulation method and system for simulating an organic EL device, by which a device arrangement capable of reducing optical variations is achievable.

Still yet another object of the invention is to provide an organic EL device which, on the basis of the results of simulations, is such designed as to reduce optical variations.

In order to construct an accurate simulation model, the inventors have made study after study on the following premises:

(1) reflected light other than light reflected at a metal surface is quantitatively taken into consideration;

(2) since the device to which the present invention is applied is a multilayer structure with a refractive index difference of at most 2 times, only one reflection at an interface other than the metal surface is taken into account; that is, two or more reflections can be neglected; and (3) the concept of localized light emitting surfaces is extended to a non-localized model.

These objects are achieved by the inventions defined below as (1) to (8):

(1) A simulation method for simulating an organic EL device having a metal surface on one side and comprising a light emitting source and a plurality of optical thicknesses, in which a simulation model represented by I, given below, is formulated, and a structural design for taking out light is prepared from emission spectra obtained from the simulation model I:

Simulation Model I an organic EL device comprising a q-species layer located on a metal surface side of a light emitting source, and a p-species layer located on a side that faces away from said metal surface side and having a refractive index different from that of said q-species layer, wherein:

a total composite wave $\Phi[\lambda]$ composed of waves $\Phi$nm reflected at interfaces is given by $$\Phi[\lambda] = \Phi_1 + \sum_{t=1}^{p-1} \Phi_{t,t+1} + \sum_{t=1}^{q-1} \Phi_{\bar{t},\overline{t+1}} + \sum_{t=1}^{q} \Phi_{\bar{t},\overline{t-1}}$$

where $\lambda$ is a wavelength, $\Phi$nm is a reflected wave upon incidence from an n-layer on an m-layer, p>1, and q 1, with the proviso that the p-layer is made up of a glass or atmosphere having a thickness sufficient to make no contribution to interference, and when q=1, a third term on a right-hand side is zero, and provided that – written above each suffix, i.e., an invert symbol is a quantity regarding a layer located on the metal surface side with respect to a light emitting point, and the same shall apply hereinafter, a composite wave $\Phi$l, which is encompassed in the total composite wave $\Phi[\lambda]$ and is composed of a light component emitted forwardly from the light emitting source and then emitted out without reflection at an interface, and a light component emitted backwardly from the light emitting source, reflected forwardly at the metal surface and then emitted out without reflection at another interface, is given by $$\Phi_1 = \Phi_0 + \Phi_{\bar{0}}$$

$$\Phi_{\bar{0}} = r_{\bar{q},m}\Phi_0 \exp\left[2\pi i\left(\frac{2L_{\bar{1}\bar{q}}}{\lambda}\right)\right]$$

$$L_{\bar{1}\bar{q}} = \sum_{t=1}^{q}\Delta_{\bar{t}}$$

$$r_{\bar{q}m} = -k$$

$$\Delta_{\bar{t}} = d_{\bar{t}}n_{\bar{t}}$$

where $n_m$ is a refractive index of the m-layer, $\Delta$m is an optical path length of the m-layer, $r_{mn}$ is an amplitude reflectance upon incidence of a light wave from the m-layer on the n-layer, $\Phi$ is an amplitude of the light wave, $\rho$ is a square of the amplitude of the light wave (energy), L is an optical path length, $\lambda$ is a wavelength, d is a film thickness, and n is a refractive index, and the same shall apply hereinafter, a light component, which is encompassed in the total composite wave $\Phi[\lambda]$, and is emitted forwardly from the light emitting source, reflected at a t-th layer interface, reflected forwardly at the metal surface and then emitted out without reflection at the another interface, is given by $$\Phi_{t,t+1} = r_{t,t+1}r_{\bar{q},m}\Phi_1 \exp\left[2\pi i\left(\frac{2L_{t,\bar{q}}}{\lambda}\right)\right]$$

$$L_{t,\bar{q}} = \sum_{j=1}^{q}\Delta_{\bar{j}} + \sum_{j=1}^{t}\Delta_{j}$$

$$r_{t,t+1} = \frac{n_t - n_{t+1}}{n_t + n_{t+1}}$$

$$\Delta_{\bar{t}} = d_{\bar{t}}n_{\bar{t}}$$

$$\Delta_t = d_t n_t$$

a light component, which is encompassed in the total composite wave $\Phi[\lambda]$, and is emitted barkwardly from the light emitting source, reflected forwardly at the t-th layer interface and then emitted out without reflection at the another interface, is given by $$\Phi_{\bar{t},\overline{t+1}} = r_{\bar{t},\overline{t+1}}\Phi_0 \exp\left[2\pi i\left(\frac{2L_{T,\bar{t}}}{\lambda}\right)\right]$$

$$L_{T,\bar{t}} = \sum_{j=1}^{t}\Delta_{\bar{j}}$$

$$r_{\bar{t},\overline{t+1}} = \frac{n_{\bar{t}} - n_{\overline{t+1}}}{n_{\bar{t}} + n_{\overline{t+1}}}$$

a light component, which is encompassed in the total composite wave $\Phi[\lambda]$, and is emitted backwardly from the light emitting source, reflected forwardly at the metal surface, reflected at the t-th layer interface, reflected forwardly at the metal surface and then emitted out without reflection at other interface, is given by $$\Phi_{\bar{t},\overline{t-1}} = r_{\bar{t},\overline{t-1}}\Phi_0 r_{\bar{q}m} \exp\left[2\pi i\left(\frac{2L_{\bar{t},\bar{q}}}{\lambda}\right)\right]$$

$$L_{\bar{t},\bar{q}} = \sum_{j=t}^{q}\Delta_{\bar{j}}$$

$$r_{\bar{t},\overline{t-1}} = \frac{n_{\bar{t}} - n_{\overline{t-1}}}{n_{\bar{t}} + n_{\overline{t-1}}}$$

$$\Phi_{T_{\bar{0}}} = \Phi_{T_1}$$

$$\Phi_{T_1} = r_{T_1}\Phi_0 r_{\bar{q}m} \exp\left[2\pi i\left(\frac{2L_{\bar{1},\bar{q}}}{\lambda}\right)\right]$$

$$r_{T_1} = \frac{n_T - n_1}{n_T + n_1}$$

a normalized modulated spectrum $\rho[\lambda]$ obtained from a composite wave of said light components is given by $$\rho[\lambda] = \Phi[\lambda]\Phi[\lambda]^*$$

$$\frac{\rho[\lambda]}{\Phi_0 \Phi_0^*} = \rho_1[\lambda] + \rho_2[\lambda] + \rho_3[\lambda] + \rho_4[\lambda]$$

$$\rho_1[\lambda] = \left(1 + k^2 + 2k\cos\left[2\pi\left(\frac{2L_{T,\bar{q}}}{\lambda} + \frac{1}{2}\right)\right]\right)$$

$$\rho_2[\lambda] = \rho_1[\lambda]\sum_{t=1}^{p-1} 2r_{t,t+1}\cos\left[2\pi\left(\frac{2L_{t,\bar{q}}}{\lambda} + \frac{1}{2}\right)\right]$$

$$\rho_3[\lambda] = \sum_{t=1}^{q-1} 2r_{\bar{t},\overline{t+1}}\left(\cos\left[2\pi\frac{2L_{T,\bar{t}}}{\lambda}\right] + k\cos\left[2\pi\left(\frac{2L_{T,\bar{q}} + 2L_{T,\bar{t}}}{\lambda} + \frac{1}{2}\right)\right]\right)$$

$$\rho_4[\lambda] = \sum_{t=1}^{q} 2r_{\bar{t},\overline{t+1}}$$

$$\left(k^2\cos\left[2\pi\frac{2L_{T,\bar{q}} + 2L_{\bar{t},\bar{q}}}{\lambda}\right] + k^3\cos\left[2\pi\left(\frac{2L_{\bar{t},\bar{q}}}{\lambda} - \frac{1}{2}\right)\right]\right)$$

where −k is an amplitude reflectance at the metal surface and * is a complex number, and the same shall apply hereinafter, and a spectrum $I_{EL}[\lambda]$ subjected to optical modulation and emitted out through the p-layer (glass substrate) to the outside is given by $$I_{EL}[\lambda] = I_{PL}[\lambda]\rho[\lambda]$$

where $I_{PL}[\lambda]$ is a spectrum of the light emitting source.

(2) The simulation method for simulating an organic EL device according to (1), wherein, in said simulation model I, the structural design for taking out light is further executed on emission luminance given by $$L = \int_0^\infty I_{EL}[\lambda]\theta[\lambda]d\lambda$$

where $\theta[\lambda]$ is a luminous coefficient.

(3) The simulation method for simulating an organic EL device according to (1) or (2), wherein, in said simulation model I, an interference spectrum is given by $$\Gamma[\lambda] = \int_0^{de} \rho[x,\lambda]\phi[x]dx$$

where de is a constant thickness that the light emitting layer has, $\eta[x]$ is a quantity of recombination at a point x that is an arbitrary point in the light emitting layer, $\rho[x,\lambda]$ is an intensity due to interference, and the quantity of recombination $\eta[x]$ is substituted by an emission intensity distribution $\phi[x]$, a spectrum $I_{EL}[\lambda]$ emitted from said interference spectrum to the outside is given by $$I_{EL}[\lambda] = I_{PL}[\lambda]\Gamma[\lambda]$$

and luminance L is given by $$L = \int_0^\infty I_{EL}[\lambda]\theta[\lambda]d\lambda$$

(4) A simulation system for simulating an organic EL device having a metal surface on one side and comprising a light emitting species and a plurality of optical thicknesses, which comprises:

a control program having a developed simulation model represented by I, given below, and an operation means controlled by said control program to calculate an emission spectrum:

Simulation Model I an organic EL device comprising a q-species layer located on a metal surface side of a light emitting source, and a p-species layer located on a side that faces away from said metal surface side and having a refractive index different from that of said q-species layer, wherein:

a total composite wave $\Phi[\lambda]$ composed of waves $\Phi nm$ reflected at interfaces is given by $$\Phi[\lambda] = \Phi_1 + \sum_{t=1}^{p-1}\Phi_{t,t+1} + \sum_{t=1}^{q-1}\Phi_{\bar{t},\overline{t+1}} + \sum_{t=1}^{q}\Phi_{\bar{t},\overline{t-1}}$$

where $\lambda$ is a wavelength, $\Phi nm$ is a reflected wave upon incidence from an n-layer on an m-layer, p>1, and q 1, with the proviso that the p-layer is made up of a glass or atmosphere having a thickness sufficient to make no contribution to interference, and when q=1, a third term on a right-hand side is zero, and provided that – written above each suffix, i.e., an invert symbol is a quantity regarding a layer located on the metal surface side with respect to a light emitting point, and the same shall apply hereinafter, a composite wave $\Phi 1$, which is encompassed in the total composite wave $\Phi[\lambda]$ and is composed of a light component emitted forwardly from the light emitting source and then emitted out without reflection at an interface, and a light component emitted backwardly from the light emitting source, reflected forwardly at the metal surface and then emitted out without reflection at another interface, is given by $$\Phi_1 = \Phi_0 + \Phi_{\bar{0}}$$

$$\Phi_{\bar{0}} = r_{\bar{q},m}\Phi_0 \exp\left[2\pi i\left(\frac{2L_{T\bar{q}}}{\lambda}\right)\right]$$

$$L_{T\bar{q}} = \sum_{t=1}^{q}\Delta_{\bar{t}}$$

$$r_{\bar{q}m} = -k$$

$$\Delta_{\bar{t}} = d_{\bar{t}}n_{\bar{t}}$$

where $n_m$ is a refractive index of the m-layer, $\Delta m$ is an optical path length of the m-layer, $r_{mn}$ is an amplitude reflectance of a light wave upon incidence from the m-layer on the n-layer, $\Phi$ is an amplitude of the light wave, $\rho$ is a square of the amplitude of the light wave (energy), L is an optical path length, $\lambda$ is a wavelength, d is a film thickness, and n is a refractive index, and the same shall apply hereinafter, a light component, which is encompassed in the total composite wave $\Phi[\lambda]$, and is emitted forwardly from the light emitting source, reflected at a t-th layer interface, reflected forwardly at the metal surface and then emitted out without reflection at the another interface, is given by $$\Phi_{t,t+1} = r_{t,t+1}r_{\bar{q},m}\Phi_1 \exp\left[2\pi i\left(\frac{2L_{tq}}{\lambda}\right)\right]$$

$$L_{tq} = \sum_{j=1}^{q}\Delta_{\bar{j}} + \sum_{j=1}^{t}\Delta_j$$

$$r_{t,t+1} = \frac{n_t - n_{t+1}}{n_t + n_{t+1}}$$

$$\Delta_{\bar{t}} = d_{\bar{t}}n_{\bar{t}}$$

$$\Delta_t = d_t n_t$$

a light component, which is encompassed in the total composite wave $\Phi[\lambda]$, and is emitted barkwardly from the light emitting source, reflected forwardly at the t-th layer interface and then emitted out without reflection at the another interface, is given by $$\Phi_{\bar{t},\overline{t+1}} = r_{\bar{t},\overline{t+1}}\Phi_0 \exp\left[2\pi i\left(\frac{2L_{T,\bar{t}}}{\lambda}\right)\right]$$

$$L_{T,\bar{t}} = \sum_{j=1}^{t}\Delta_{\bar{j}}$$

$$r_{\bar{t},\overline{t+1}} = \frac{n_{\bar{t}} - n_{\overline{t+1}}}{n_{\bar{t}} + n_{\overline{t+1}}}$$

a light component, which is encompassed in the total composite wave $\Phi[\lambda]$, and is emitted backwardly from the light emitting source, reflected forwardly at the metal surface, reflected at the t-th layer interface, reflected forwardly at the metal surface and then emitted out without reflection at the another interface, is given by $$\Phi_{\bar{i},\bar{i}-1} = r_{\bar{i},\bar{i}-1}\Phi_0 r_{qm} \exp\left[2\pi i\left(\frac{2L_{\bar{i},q}}{\lambda}\right)\right]$$

$$L_{\bar{i},q} = \sum_{j=\bar{i}}^{q}\Delta_{\bar{j}}$$

$$r_{\bar{i},\bar{i}-1} = \frac{n_{\bar{i}} - n_{\bar{i}-1}}{n_{\bar{i}} + n_{\bar{i}-1}}$$

$$\Phi_{T_0} = \Phi_{T_1}$$

$$\Phi_{T_1} = r_{T_1}\Phi_0 r_{qm} \exp\left[2\pi i\left(\frac{2L_{T,q}}{\lambda}\right)\right]$$

$$r_{T_1} = \frac{n_T - n_1}{n_T + n_1}$$

a modulated spectrum $\rho[\lambda]$ obtained from a composite wave of said light components is given by $$\rho[\lambda] = \Phi[\lambda]\Phi[\lambda]^*$$

$$\frac{\rho[\lambda]}{\Phi_0\Phi_0^*} = \rho_1[\lambda] + \rho_2[\lambda] + \rho_3[\lambda] + \rho_4[\lambda]$$

$$\rho_1[\lambda] = \left(1 + k^2 + 2k\cos\left[2\pi\left(\frac{2L_{T,q}}{\lambda} + \frac{1}{2}\right)\right]\right)$$

$$\rho_2[\lambda] = \rho_1[\lambda]\sum_{t=1}^{p-1}2r_{t,t+1}\cos\left[2\pi\left(\frac{2L_{\bar{i},q}}{\lambda} + \frac{1}{2}\right)\right]$$

$$\rho_3[\lambda] = \sum_{t=1}^{q-1}2r_{\bar{i},\bar{i}+1}\left(\cos\left[2\pi\frac{2L_{T,\bar{i}}}{\lambda}\right] + k\cos\left[2\pi\left(\frac{2L_{T,q}+2L_{T,\bar{i}}}{\lambda} + \frac{1}{2}\right)\right]\right)$$

$$\rho_4[\lambda] = \sum_{t=1}^{q}2r_{\bar{i},\bar{i}+1}\left(k^2\cos\left[2\pi\frac{2L_{T,q}+2L_{\bar{i},q}}{\lambda}\right] + k^3\cos\left[2\pi\left(\frac{2L_{\bar{i},q}}{\lambda} - \frac{1}{2}\right)\right]\right)$$

where −k is an amplitude reflectance at the metal surface and * is a complex number, and the same shall apply hereinafter, and a spectrum $I_{EL}[\lambda]$ subjected to optical modulation and emitted out through the p-layer (glass substrate) to the outside is given by $$I_{EL}[\lambda] = I_{PL}[\lambda]\rho[\lambda]$$

where $I_{PL}[\lambda]$ is a spectrum of the light emitting source, and in said formulae, $n_m$ is a refractive index of the m-layer, $\Delta m$ is an optical path length of the m-layer, $r_{mn}$ is an amplitude reflectance upon incidence of a light wave from the m-layer on the n-layer, $\Phi$ is an amplitude of the light wave, $\rho$ is a square of the amplitude of the light wave (energy), L is an optical path length, $\lambda$ is a wavelength, d is a film thickness, and n is a refractive index.

(5) The simulation system for simulating an organic EL device according to (4), wherein, in said simulation model I, the structural design for taking out light is further executed on emission luminance given by $$L = \int_0^\infty I_{EL}[\lambda]\theta[\lambda]d\lambda$$

where $\theta[\lambda]$ is a luminous coefficient.

(6) The simulation system for simulating an organic EL device according to (4) or (5), wherein, in said simulation model I, an interference spectrum is given by $$\Gamma[\lambda] = \int_0^{de}\rho[x,\lambda]\phi[x]dx$$

where de is a constant thickness that the light emitting layer has, $\eta[x]$ is a quantity of recombination at a point x that is an arbitrary point in the light emitting layer, $\rho[x,\lambda]$ is an intensity due to interference, and the quantity of recombination $\eta[x]$ is substituted by an emission intensity distribution $\phi[x]$, a spectrum $I_{EL}[\lambda]$ emitted from said interference spectrum to the outside is given by $$I_{EL}[\lambda] = I_{PL}[\lambda]\Gamma[\lambda]$$

and
luminance L is given by $$L = \int_0^\infty I_{EL}[\lambda]\theta[\lambda]d\lambda$$

(7) An organic EL device comprising a glass substrate with a refractive index being n 1.5, and in order from said glass substrate, a hole injecting electrode with a refractive index being 1.8 n 2.1, an organic layer with a refractive index being 1.7 n 2.1 and an electron injecting electrode having a reflectance of at least 50% in a wavelength region of 300 to 700 nm, wherein:

a luminance variation is confined within ±5% with the proviso that the total of optical thicknesses (n×film thickness) of said hole injecting electrode and said organic layer is 1.9×200 nm or lower.

(8) An organic EL device comprising a glass substrate with a refractive index being n 1.5, and in order from said glass substrate, a buffer layer with a refractive index being 1.8 n 2.1, a hole injecting electrode with a refractive index being 1.8 n 2.1, an organic layer with a refractive index being 1.7 n 2.1 and an electron injecting electrode having a reflectance of at least 50% in a wavelength region of 300 to 700 nm, wherein:

a luminance variation is confined within ±5% with the proviso that the total of optical thicknesses (n×film thickness) of said hole injecting electrode, said buffer layer and said organic layer is 1.9×700 nm or greater.

The logical expression that was the simulation model of the invention was applied to an organic EL device comprising Alq3 as will be described later. By comparison, it was found that both the emission spectra and luminance are in good agreement with the experimental values. It is thus possible to make a quantitative and accurate estimation of spectra. It is also possible to determine a structure capable of taking out light with high efficiency, even when the structure comprises many reflective surfaces and so is complicated.

On the basis of the results of simulation obtained as mentioned above, calculations were performed to determine a device arrangement for reducing spectroscopical characteristic variations resulting from device thickness. For an organic EL device, for instance, it has been found that it is preferable to locate a layer having an optical path of sufficient length (500 nm or longer) between the glass and the metal surface or confine a film thickness distribution within about ±10 nm.

DETAILED DESCRIPTION OF THE INVENTION

The present invention provides a simulation method for simulating an organic EL device having a metal surface on one side and comprising a light emitting source and a plurality of optical thicknesses, in which a simulation model represented by I, given below, is formulated, and a structural design for taking out light efficiently is prepared from emission spectra obtained from the simulation model I.

Simulation Model I

Figure 1:
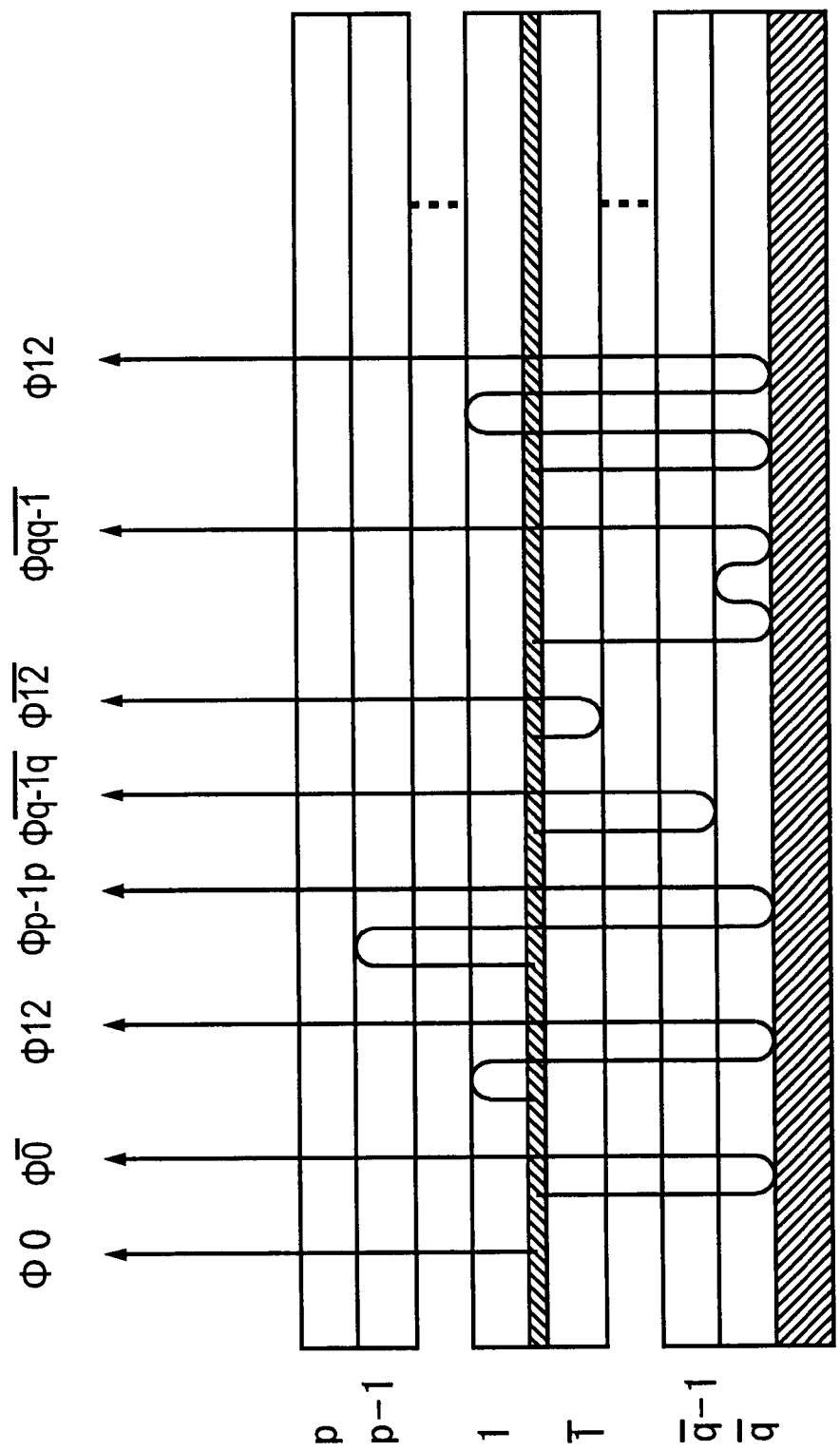
FIG. 1 is a conceptual illustration of the organic EL device that is the simulation model of the invention.

An organic EL device comprising a q-species layer located on a metal surface side, and a p-species layer located on a side facing away the metal surface side and having a refractive index different from that of the q-species layer as typically shown in FIG. 1, wherein:

a wave reflected at each interface is given by $$\Phi[\lambda] = \Phi_1 + \sum_{t=1}^{p-1} \Phi_{t,t+1} + \sum_{t=1}^{q-1} \Phi_{t,\overline{t+1}} + \sum_{t=1}^{q} \Phi_{t,\overline{t-1}}$$

where λ is a wavelength, Φnm is a reflected wave upon incidence from an n-layer onto an m-layer, p>1, and q 1, with the proviso that the p-layer is made up of a glass or atmosphere having a thickness sufficient to make no contribution to interference, and when q=1, a third term on a right-hand side is zero, and provided that − written above each suffix, i.e., an invert symbol is a quantity regarding a layer located on the metal surface side with respect to a light emitting point, and the same shall apply hereinafter, a light component emitted forwardly from the light emitting source and then emitted out without reflection at an interface, and a light component emitted backwardly from the light emitting source, reflected forwardly at the metal surface and then emitted out without reflection at another interface, are given by $$\Phi_1 = \Phi_0 + \Phi_{\overline{0}}$$

$$\Phi_{\overline{0}} = r_{q,m}\Phi_0 \exp\left[2\pi i\left(\frac{2L_{\overline{1q}}}{\lambda}\right)\right]$$

$$L_{\overline{1q}} = \sum_{t=1}^{q} \Delta_{\overline{t}}$$

$$r_{\overline{q}m} = -k$$

$$\Delta_{\overline{t}} = d_{\overline{t}} n_{\overline{t}}$$

where $n_m$ is a refractive index of the m-layer, Δm is an optical path length of the m-layer, $r_{mn}$ is an amplitude reflectance upon incidence of a light wave from the m-layer on the n-layer, Φ is an amplitude of the light wave, ρ is a square of the amplitude of the light wave (energy), L is an optical path length, λ is a wavelength, d is a film thickness, and n is a refractive index, and the same shall apply hereinafter, a light component emitted forwardly from the light emitting source, reflected at a t-th layer interface, reflected forwardly at the metal surface and then emitted out without reflection at the another interface, is given by $$\Phi_{t,t+1} = r_{t,t+1} r_{\overline{q},m} \Phi_1 \exp\left[2\pi i\left(\frac{2L_{t,\overline{q}}}{\lambda}\right)\right]$$

$$L_{t,\overline{q}} = \sum_{j=1}^{q} \Delta_{\overline{j}} + \sum_{j=1}^{t} \Delta_j$$

$$r_{t,t+1} = \frac{n_t - n_{t+1}}{n_t + n_{t+1}}$$

$$\Delta_{\overline{t}} = d_{\overline{t}} n_{\overline{t}}$$

$$\Delta_t = d_t n_t$$

a light component emitted barkwardly from the light emitting source, reflected forwardly at the t-th layer interface and then emitted out without reflection at the another interface, is given by $$\Phi_{\bar{i},\overline{i+1}} = r_{\bar{i},\overline{i+1}} \Phi_0 \exp\left[2\pi i\left(\frac{2L_{T,\bar{i}}}{\lambda}\right)\right]$$

$$L_{T,\bar{i}} = \sum_{j=1}^{t} \Delta_j$$

$$r_{\bar{i},\overline{i+1}} = \frac{n_{\bar{i}} - n_{\overline{i+1}}}{n_{\bar{i}} + n_{\overline{i+1}}}$$

a light component emitted backwardly from the light emitting source, reflected forwardly at the metal surface, reflected at the t-th layer interface, reflected forwardly at the metal surface and then emitted out without reflection at the another interface, is given by $$\Phi_{\bar{i},\overline{i-1}} = r_{\bar{i},\overline{i-1}} \Phi_0 r_{qm} \exp\left[2\pi i\left(\frac{2L_{\bar{i},q}}{\lambda}\right)\right]$$

$$L_{\bar{i},q} = \sum_{j=\bar{i}}^{q} \Delta_j$$

$$r_{\bar{i},\overline{i-1}} = \frac{n_{\bar{i}} - n_{\overline{i-1}}}{n_{\bar{i}} + n_{\overline{i-1}}}$$

$$\Phi_{T_0} = \Phi_{T_1}$$

$$\Phi_{T_1} = r_{T_1} \Phi_0 r_{qm} \exp\left[2\pi i\left(\frac{2L_{T,q}}{\lambda}\right)\right]$$

$$r_{T_1} = \frac{n_T - n_1}{n_T + n_1}$$

a modulated spectrum $\rho[\lambda]$ obtained from a composite wave of the light components is given by $$\rho[\lambda] = \Phi[\lambda]\Phi[\lambda]^*$$

$$\frac{\rho[\lambda]}{\Phi_0 \Phi_0^*} = \rho_1[\lambda] + \rho_2[\lambda] + \rho_3[\lambda] + \rho_4[\lambda]$$

$$\rho_1[\lambda] = \left(1 + k^2 + 2k\cos\left[2\pi\left(\frac{2L_{T,q}}{\lambda} + \frac{1}{2}\right)\right]\right)$$

$$\rho_2[\lambda] = \rho_1[\lambda] \sum_{t=1}^{p-1} 2r_{t,t+1} \cos\left[2\pi\left(\frac{2L_{t,q}}{\lambda} + \frac{1}{2}\right)\right]$$

$$\rho_3[\lambda] = \sum_{t=1}^{q-1} 2r_{\bar{i},\overline{i+1}} \left(\cos\left[2\pi\frac{2L_{T,\bar{i}}}{\lambda}\right] + k\cos\left[2\pi\left(\frac{2L_{T,q} + 2L_{T,\bar{i}}}{\lambda} + \frac{1}{2}\right)\right]\right)$$

$$\rho_4[\lambda] = \sum_{t=1}^{q} 2r_{\bar{i},\overline{i+1}} \left(k^2 \cos\left[2\pi\frac{2L_{T,q} + 2L_{\bar{i},q}}{\lambda}\right] + k^3 \cos\left[2\pi\left(\frac{2L_{\bar{i},q}}{\lambda} - \frac{1}{2}\right)\right]\right)$$

where −k is an amplitude reflectance at the metal surface and * is a complex number, and the same shall apply hereinafter, and a spectrum $I_{EL}[\lambda]$ emitted out through the p-layer (glass substrate) to the outside is given by $$I_{EL}[\lambda] = I_{PL}[\lambda]\rho[\lambda]$$

where $I_{PL}[\lambda]$ is a spectrum of the light emitting source.

By use of such a simulation model, a simulation can be run while reflections at a plurality of interfaces having different refractive indices are taken into consideration, in addition to light emitted directly from the light emitting source and reflected light emitted out through the metal surface, which have so far been taken into account, so that the modulated spectral intensity can be obtained with relative ease. In the above simulation model, only the light subjected to one reflection is taken into consideration, and the composite light wave $\Phi[\lambda]$ with consideration given to light reflected at all interfaces is obtained by simple superposition of these light components. This in turn makes it possible to simplify the model, so that an approximate model with high precision can be obtained with relative ease. In the above simulation model, therefore, the term including r of second or higher orders is neglected because of being sufficiently smaller than 1. Also, transformation formulae for trigonometric functions and exponential functions are used.

In addition, the structural design for taking out light efficiently can be prepared from the emission luminance given by $$L = \int_0^\infty I_{EL}[\lambda]\theta[\lambda]d\lambda$$

where $\theta[\lambda]$ is a luminous coefficient.

In the above simulation model, the light emitting source is treated as a point source from which light emerges in a non-divergent manner. To achieve further generalization, here consider a light emitting area having a distribution. In an organic EL device light emitting sources can generally be regarded as an array of point light sources having no relation to each other. From this it is found that to obtain satisfactory results, only the superposition of such localized models is needed.

Figure 2:
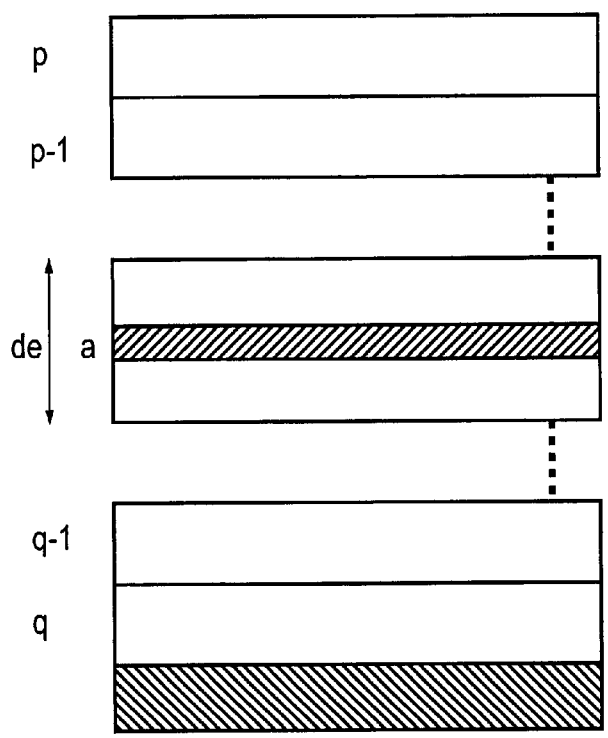
FIG. 2 is a conceptual illustration of the organic EL device shown in FIG. 1, which comprises a light emitting area having a constant width.

To extend the above model naturally, however, here consider a light emitting layer having a constant thickness de, as shown in FIG. 2 for instance, and assume that localized light emission a is sandwiched between light emitting areas d1+ and d1− (note that −1 stands for an invert with − written above 1) and the refractive indices of both areas are n1=n−1. Then, d1 or d−1 (either one of which has an arbitrary spread from 0 to de) may be regarded as being tantamount to the superposition of localized light emissions from 0 to de.

Here assume that the emission intensities of point light sources vary in a site depending manner, but their spectra (fluorescent spectra, etc. in the case of an organic EL device) are the same at light emitting points. For instance, an organic EL device has an emission intensity proportional to the quantity of recombination of electrons and holes. The quantity of recombination has a distribution in the device, but its spectra per se are site-independent because they are the same as the fluorescent spectra, etc. To find interference spectra under such conditions, one must have a knowledge of the quantity of recombination $\eta[x]$ at a point x that is an arbitrary point in the device. The light emitted from the point x has an intensity of $\rho[x,\lambda]$ due to interference; that is, if $\eta[x]$ multiplied by $\rho[x,\lambda]$ is integrated with respect to x over the light emitting areas, an interference spectrum $\Gamma[\lambda]$ can then be obtained. It is to be noted that the quantity of recombination $\mu[x]$ of electrons and holes is here substituted by an emission intensity distribution $\phi[x]$, because the quantity of recombination is proportional to the emission intensity as mentioned above.

$$\Gamma[\lambda] = \int_0^{de} \rho[x,\lambda]\phi[x]dx$$

As already mentioned, n1=n−1 (note that −1 stands for an invert with − written above 1) and d1+d−1=de. Now let the end of the light emitting layer be zero. Then, integration with respect to d−1=0 to de is obtainable.

$$\Gamma[\lambda] = \int_0^{d_e} \rho[d_T, \lambda]\phi[d_T]d\,d_T \begin{cases} d_T + d_1 = de = \text{constant} \\ n_T = n_1 \end{cases}$$

Hence, the spectra emitted out to the outside is given by $$I_{EL}[\lambda]=I_{PL}[\lambda]\Gamma[\lambda]$$

Emission intensity is given by $$L = \int_0^\infty I_{EL}[\lambda]\theta[\lambda]d\lambda$$

In the above considerations, the spectra of the light emitting point sources (the fluorescent spectral of the organic EL device) are regarded as being the same at light emitting points. However, the above mathematical model should be subjected to some alternations when they vary depending on the light emitting points.

Let $I_{PL}[d-1,\lambda]$ be the emission intensity of the organic EL device at a distance d−1 from the end of the light emitting area. Then, $I_{EL}[\lambda]$ is reduced to the following integration expression. In this regard, it is noted that −1 stands for an invert with − written above 1.

$$I_{EL}[\lambda] = \int_0^{d_e} \rho[d_T, \lambda]\phi[d_T]I_{PL}[d_T, \lambda]d\,d_T$$

Further, let θ be a luminous coefficient. Then, luminance L is given by $$L = \int_0^\infty I_{EL}[\lambda]\theta[\lambda]d\lambda$$

According to the present invention, a simulation system for obtaining emission spectra and emission luminance may be achieved by developing simulation model I used in the method of the invention on a program as a part of a control algorithm, and executing the same by an operation means.

The program for developing the above simulation model may be written in any low-level or high-level language capable of developing the model, e.g., assembler language, C language, FORTRAN, and BASIC. As means for developing this simulation model, methods ordinarily used to develop mathematical models may be utilized.

For media for storing the program, for instance, use may be made of semiconductor memories such as ROMs, RAMs and flash memories, magnetic recording media such as FDs and HDs, and optical recording media such as CDs and CD-ROMs.

For the operation means, for instance, use may be made of microprocessors that can be operated by direct access to a semiconductor memory, etc. with the program stored therein, and personal computers with built-in microprocessors. The results of operation may be available on displays or printers via control means, operating systems, etc. Parameters may be entered in personal computers, etc. via keyboards, external connection busses, and communications means. Thus, the system of the invention may be achieved by entering the above simulation program in, for instance, a general-purpose personal computer, a work station, etc.

Next, the organic EL structure to be analyzed by the simulation method of the invention is explained. The organic EL device used herein, for instance, comprises on its substrate a hole injecting electrode, an electron injecting electrode, and at least one organic layer interleaved between both the electrodes. Each of the organic layer comprises at least one hole transporting layer and at least one light emitting layer, and is provided thereon with an electron injecting electrode. In addition, a protective electrode may be provided in the form of the uppermost layer. It is to be noted that the hole transporting layer may be dispensed with. The electron injecting electrode in a film form is made up of a metal having a low work function or a compound or alloy thereof by means of evaporation, and sputtering techniques, preferably a sputtering process. A so-called reverse multi-layer structure with the electron injecting electrode located nearest to the substrate side, too, may be used in the present invention.

For the hole injecting electrode, it is usually preferable to use a transparent electrode because the organic EL device is designed to take out the emitted light from the substrate side thereof. The material for such a transparent electrode, for instance, includes ITO (tin-doped indium oxide), IZO (zinc-doped indium oxide), ZnO, $SnO_2$, and $In_2O_3$, with ITO (tin-doped indium oxide), and IZO (zinc-doped indium oxide) being preferred. Referring to ITO, it is desired that the mixing ratio of $SnO_2$ with respect to $In_2O_3$ be in the range of 1 to 20 wt %, and especially 5 to 12 wt %. Referring to IZO, it is again desired that the mixing ratio of ZnO with respect to $In_2O_3$ be in the range of 12 to 32 wt %. Besides, ITO, and IZO may contain an oxide form of Sn, Ti, Pb, etc. in an amount of at most 1 wt % calculated as oxide.

The hole injecting electrode may be formed as by evaporation, but should preferably be formed by a sputtering technique. When a sputtering process is applied to the formation of an ITO or IZO electrode, it is preferable to use a target comprising $In_2O_3$ doped with $SnO_2$ or ZnO. An ITO transparent electrode, when formed by the sputtering technique, suffers a lesser light emission luminance change with time, as compared with an electrode formed by evaporation. For the sputtering technique, it is preferable to use DC sputtering. Power input is then preferably in the range of 0.1 to 4 $W/cm^2$. A more preferable range is 0.1 to 10 $W/cm^2$, and especially 0.2 to 5 $W/cm^2$. The film forming rate is preferably in the range of 2 to 100 nm/min., and especially 5 to 50 nm/min.

Preferably, but not exclusively, an inert gas such as Ar, He, Ne, Kr, and Xe or a mixture of such inert gases is used as the sputtering gas. The sputtering pressure of such gases may usually be of the order of 0.1 to 20 Pa.

The hole injecting electrode may have at least a certain thickness enough for hole injection; that is, it may have a thickness of usually 5 to 500 nm, and especially 10 to 300 nm.

For the material that forms a film form of electron injecting electrode, it is preferable to use a material effective for injection of electrons and having a low work function. Consequently, metals or alloys forming such an electron injecting electrode may usually be used as sputtering targets. These have a work function of 4.5 eV or lower. In the invention, particular preference is given to metals and alloys having a work function of 4.0 eV or lower.

Preferably, the sputtering gas pressure during sputtering is in the range of 0.1 to 5 Pa. By regulating the sputtering gas pressure within this range, it is possible to easily obtain an AlLi alloy having an Li concentration in the aforesaid range. By altering the sputtering gas pressure in the aforesaid range during film formation, it is also possible to easily obtain an electron injecting electrode having such an Li concentration gradient as defined above. In the invention, it is further preferable to form films under such conditions that the product of the film forming gas pressure and the substrate-target distance satisfies 20 to 65 Pa.cm.

For the sputtering gas, use is made of inert gases employed with ordinary sputtering systems. For reactive sputtering, reactive gases such as $N_2$, $H_2$, $O_2$, $C_2H_4$, and $NH_3$ may be used in addition to these gases.

In the practice of the invention, it is possible to use an RF sputtering process using an RF power source or the like as the sputtering technique. In view of the ease with which the film forming rate is controlled, and less damage to the organic EL device structure, however, it is preferable to use a DC sputtering process. Power for operating a CD sputtering system is in the range of preferably 0.1 to 10 W/cm$^2$, and especially 0.5 to 7 W/cm$^2$. The film forming rate is preferably in the range of 5 to 100 nm/min., and especially 10 to 50 nm/min.

The thin film form of electron injecting electrode may have at least a certain thickness great enough for the injection of electrons, e.g., of at least 1 nm, and preferably at least 3 nm. Thus, a film thickness of the order of 3 to 500 nm is usually preferable although there is no upper limit thereon.

The organic EL device used herein may preferably have a protective electrode on the electron injecting electrode, i.e., on the side of the electron injecting electrode that faces away from the organic layer. By the provision of the protective electrode, the electron injecting electrode is protected against the air, moisture, etc., so that the degradation of the constituting thin film can be prevented, resulting in the stabilization of electron injection efficiency and an ever greater increase in the service life of the device. The protective electrode has a very low resistance, and so may also function as an interconnecting electrode when the electron injecting electrode has a high resistance. The protective electrode may contain at least one of Al; Al and a transition metal except Ti; Ti; and titanium nitride (TiN).

The protective electrode may have at least a certain thickness great enough to make sure of electron injection efficiency and prevent penetration of moisture, oxygen or organic solvents, for instance, of at least 50 nm, preferably at least 100 nm, and especially 100 to 1,000 nm. With too thin a protective electrode layer, neither are the advantages of the invention obtainable, nor is sufficient connection with terminal electrodes obtainable because the ability of the protective electrode layer to cover steps becomes low. When the protective electrode layer is too thick, on the other hand, the growth rate of dark spots becomes high because of an increase in the stress of the protective electrode layer. It is here to be noted that when the protective electrode functions as an interconnecting electrode, its thickness may be usually of the order of 100 to 500 nm so as to make up for the high film resistance of the electron injecting electrode due to its thinness, and that when the protective electrode functions as other interconnecting electrode, its thickness may be of the order of 100 to 300 nm.

Preferably, but not exclusively, the total thickness of the electron injecting electrode plus the protective electrode is usually of the order of 100 to 1,000 nm.

In addition to the aforesaid protective electrode, an additional protective film may be formed after the formation of the electrode. The protective film may be formed of either an inorganic material such as SiOx or an organic material such as Teflon, and a chlorine-containing carbon fluoride polymer. The protective film may be either transparent or opaque, and has a thickness of the order of 50 to 1,200 nm.

The protective film may be formed either by the aforesaid reactive sputtering process or conventional processes such as general sputtering, evaporation or PECVD.

Next, the organic material layers provided in the organic EL device according to the invention are explained.

The light emitting layer has functions of injecting holes and electrons, transporting them, and recombining holes and electrons to create excitons. For the light emitting layer, it is preferable to use a relatively electronically neutral compound.

The hole injecting and transporting layer has functions of facilitating injection of holes from the hole injecting electrode, providing stable transportation of holes and blocking electrons, and the electron injecting and transporting layer has functions of facilitating injection of electrons from the cathode, providing stable transportation of electrons and blocking holes. These layers are effective for increasing the number of holes and electrons injected into the light emitting layer and confining holes and electrons therein for optimizing the recombination region to improve emission efficiency.

The thickness of the light emitting layer, the hole injecting and transporting layer, and the electron injecting and transporting layer is not critical and varies with a particular formation technique although it is usually of the order of preferably 5 to 500 nm, and especially 10 to 300 nm.

The thickness of the hole injecting and transporting layers, and the electron injecting and transporting layer is equal to, or about $\frac{1}{10}$ times to about 10 times as large as the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 1 nm thick. The upper limit on thickness is usually about 500 nm for the injecting layer and about 500 nm for the transporting layer. The same film thickness applies when two injecting and transporting layers are provided.

In the organic EL display according to the invention, the light emitting layer contains a fluorescent material that is a compound capable of emitting light. The fluorescent material used herein, for instance, may be at least one compound selected from compounds such as those disclosed in JP-A 63-264692, e.g., quinacridone, rubrene, and styryl dyes. Use may also be made of quinoline derivatives such as metal complex dyes containing 8-quinolinol or its derivative as ligands, for instance, tris(8-quinolinolato)aluminum, tetraphenylbutadiene, anthracene, perylene, coronene, and 12-phthaloperinone derivatives. Use may further be made of phenylanthracene derivatives disclosed in Japanese Patent Application No. 6-110569, and tetraarylethene derivatives disclosed in Japanese Patent Application No. 6-114456.

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-guinolinolato)aluminum, 8-quinolinolato-lithium, tris(5-chloro-8-quinolinolato)gallium, bis(5-chloro-8-quinolinolato)calcium, 5,7-dichloro-8-quinolinolato-aluminum, tris(5,7-dibromo-8-hydroxyquinolinolato) aluminum, and poly[zinc(II)-bis(8-hydroxy-5-quinolinyl) methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenyl-phenolato)aluminum (III), bis(2-methyl-8-quinolinolato) (m-phenylphenolato)aluminum (III), bis(2-methyl-8-quinolinolato) (p-phenylphenolato)aluminum (III), bis(2 -methyl-8-quinolinolato)(2,3-dimethylphenolato)aluminum (III), bis(2-methyl-8-quinolinolato)(2,6-dimethylphenolato) aluminum (III), bis(2-methyl-8-quinolinolato)(3,4-dimethylphenolato)aluminum (III), bis(2-methyl-8-quinolinolato)(3,5-dimethyl-phenolato)aluminum (III), bis (2-methyl-8-quinolinolato)(3,5-di-tert-butylphenolato) aluminum (III), bis(2-methyl-8-quinolinolato)(2,6-diphenylphenolato)aluminum (III), bis(2-methyl-8-quinolinolato)(2,4,6-triphenylphenolato)aluminum (III), bis (2-methyl-8-quinolinolato)(2,3,6-trimethyl-phenolato) aluminum (III), bis(2-methyl-8-quinolinolato) (2,3,5,6-tetramethylphenolato)aluminum (III), bis(2-methyl-8-quinolinolato)(1-naphtholato)aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(p-phenylphenolato) aluminum (III), bis(2,4-dimethyl-8-quinolinolato)(m-phenylphenolato)aluminum (III), bis(2,4-dimethyl-8-quinolinolato)(3,5-dimethylphenolato)aluminum (III), bis (2,4-dimethyl-8-quinolinolato)(3,5-di-tert-butylphenolato) aluminum (III), bis(2-methyl-4-ethyl-8-quinolinolato)(p-cresolato)aluminum (III), bis(2-methyl-4-methoxy-8-quinolinolato)(p-phenyl-phenolato)aluminum (III), bis(2-methyl-5-cyano-8- quinolinolato)(o-cresolato)aluminum (III), and bis(2-methyl-6-trifluoromethyl-8-quinolinolato) (2-naphtholato)aluminum (III).

Besides, use may be made of bis(2-methyl-8-quinolinolato)aluminum (III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum (III)-$\mu$-oxo-bis(4-ethyl-2-methyl-8-quinolinolato)aluminum (III), bis(2-methyl-4-methoxyquinolinolato)aluminum (III)-$\mu$-oxo-bis(2-methyl-4-methoxyquinolinolato)aluminum (III), bis(5-cyano-2-methyl- 8-quinolinolato)aluminum (III)-$\mu$-oxo-bis(5-cyano-2-methyl-8-quinolinolato)aluminum (III), bis(2-methyl-5-trifluoromethyl-8-quinolinolato)aluminum (III)-$\mu$-oxo-bis(2-methyl-5-trifluoromethyl-8-quinolinolato) aluminum (III), etc.

Other preferable host substances include phenylanthracene derivatives disclosed in Japanese Patent Application No. 6-110569, tetraarylethene derivatives disclosed in Japanese Patent Application No. 6-114456, etc.

In the practice of the invention, the light emitting layer may also serve as an electron injecting and transporting layer. In this case, it is preferable to use a fluorescent material, e.g., tris(8-quinolinolato)aluminum or the like, which may be provided by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato) aluminum ($Alq^3$). It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldlamine derivatives, styrylamine derivatives, and amine derivatives having an aromatic fused ring.

In this case, the ratio of mixing the compound capable of injecting and transporting holes with the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 80/20.

The thickness of the mixed layer must correspond to the thickness of a single molecular layer, and so is preferably less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyl-diamine (TPD)), aromatic tertiary amines, hydrazone derivatives, carbazole derivatives, triazole derivatives, imidazole derivatives, oxadiazole derivatives having an amino group, and polythiophenes. Where these compounds are used Th combination of two or more, they may be stacked as separate layers, or otherwise mixed.

When the hole injecting and transporting layer is provided as a separate hole injecting layer and a separate hole transporting layer, two or more compounds are selected in a preferable combination from the compounds already mentioned for the hole injecting and transporting layer. In this regard, it is preferred to laminate layers in such an order that a compound layer having a lower ionization potential is disposed nearest to the hole injecting electrode (ITO, etc.). It is also preferred to use a compound having good thin film forming ability at the surface of the hole injecting electrode. This order of lamination holds for the provision of two or more hole injecting and transporting layers, and is effective as well for lowering driving voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer. Like the light emitting layer and so on, the hole injecting and transporting layer or layers may be formed by evaporating the aforesaid compounds.

For the electron injecting and transporting layer which is provided if necessary, there may be used quinoline derivatives such as organic metal complexes containing 8-quinolinol or its derivatives as ligands, for instance, tris (8-quinolinolato)aluminum ($Alq^3$), oxadiazole derivatives, perylene derivatives, pyridine derivatives, pyrimidine derivatives, quinoxaline derivative, diphenylquinone derivatives, and nitro-substituted fluorene derivatives. The electron injecting and transporting layer may also serve as a light emitting layer. In this case, it is preferable to use tris(8-quinolilato)aluminum, etc. As is the case with the light emitting layer, the electron injecting and transporting layer may then be formed by evaporation or the like.

Where the electron injecting and transporting layer is a double-layered structure comprising an electron injecting layer and an electron transporting layer, two or more compounds are selected in a preferably combination from the compounds commonly used for electron injecting and transporting layers. In this regard, it is preferred to laminate layers in such an order that a compound layer having a greater electron affinity is disposed nearest to the electron injecting electrode. This order of lamination also applies where a plurality of electron injecting and transporting layers are provided.

The substrate may be provided with a color filter film, fluorescent material-containing color conversion film or dielectric reflecting film for controlling the color of light emission.

For the color filter film, a color filter employed with liquid crystal display devices may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO or IZO film formation.

The light absorbing material is used when light is not fully absorbed by the fluorescent material, and so may be dispensed with, if not required. For the light absorbing material, it is preferable to make a selection from materials that do not extinguish fluorescence.

To form the hole injecting and transporting layer, the light emitting layer and the electron injecting and transporting layer, it is preferable to use a vacuum evaporation technique which enables a homogeneous thin film to be obtained. According to the vacuum evaporation process, it is possible to obtain homogeneous thin films in an amorphous state or with a crystal grain diameter of at most 0.1 $\mu$m. The use of a thin film having a crystal grain diameter exceeding 0.1 $\mu$m results in non-uniform light emission. To avoid this, it is required to increase the driving voltage of the device; however, there is a striking drop of charge injection efficiency.

No particular limitation is imposed on vacuum evaporation conditions. However, an evaporation rate of the order of 0.01 to 1 nm/sec. is preferably applied at a degree of vacuum of $10^{-4}$ Pa or lower. It is also preferable to form the layers continuously in vacuum. If the layers are continuously formed in vacuum, high properties are then obtained because the adsorption of impurities on the interface between the adjacent layers can be avoided. Furthermore, the driving voltage of the device can be lowered while the growth and occurrence of dark spots are inhibited.

When the vacuum evaporation process is used to form the layers, each containing a plurality of compounds, it is preferable to carry out co-evaporation while boats charged with the compounds are individually placed under temperature control.

The organic EL display of the invention is generally of the DC drive type while it may be of the AC or pulse drive type. The applied voltage is generally of the order of 2 to 30 V, and especially 2 to 20 volts.

EXAMPLE

The present invention is explained more specifically with reference to the following examples.

In the examples, assume that an arrangement comprising an electron injecting (metal) electrode, an organic layer 2, an organic layer 2, a hole injecting (transparent) electrode and a glass substrate is assembled as the simplest example of an organic EL device, and let light emission occur at an interface between the organic layer 2 and the organic layer 2. Such an organic EL device was operated on a prior art simulation model, and the simulation model of the invention. The obtained results were compared with experimental data (found values).

The organic EL device comprising the above basic arrangement had the following device features (as measured by ellipsometry).

Figure 3:
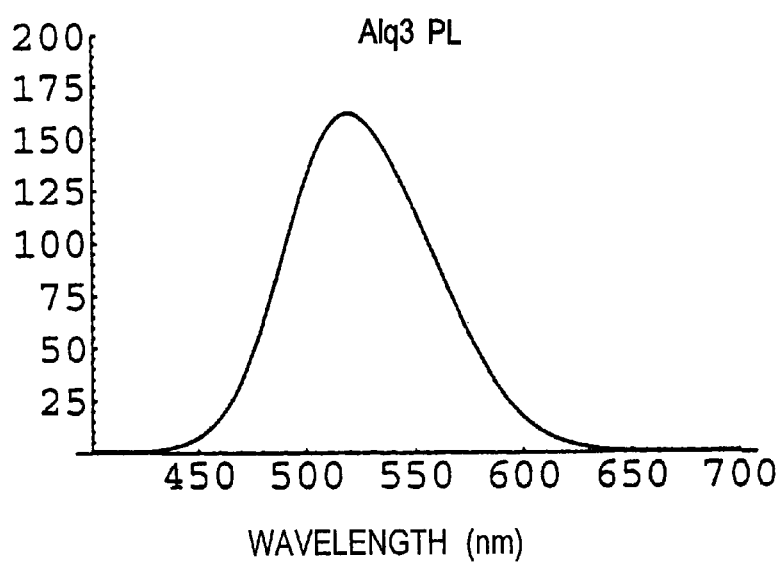
FIG. 3 is a graph showing a fluorescent spectrum of a fluorescent substance in the organic EL device used in the example.

Amplitude reflectance at the metal surface: k=1;

Organic layer 1=Alq$^3$: refractive index n1=1.7, and film thickness d1=70 nm;

Organic layer 2=TPD: refractive index n2=1.7, and film thickness d2=60 nm;

Hole injecting electrode=ITO: refractive index n3=1.9 with a change in film thickness d3;

Glass substrate: refractive index n4=1.5;

Fluorescence spectra of light emitting substance: shown in FIG. 3; and

Figure 4:
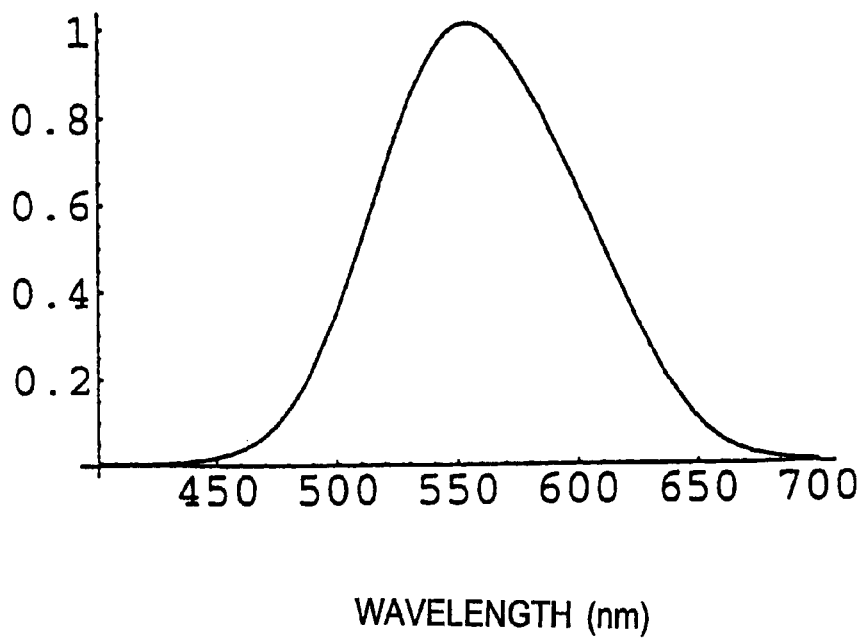
FIG. 4 is a graph showing a spectrum of the luminous coefficient used in the example.
Figure 5:
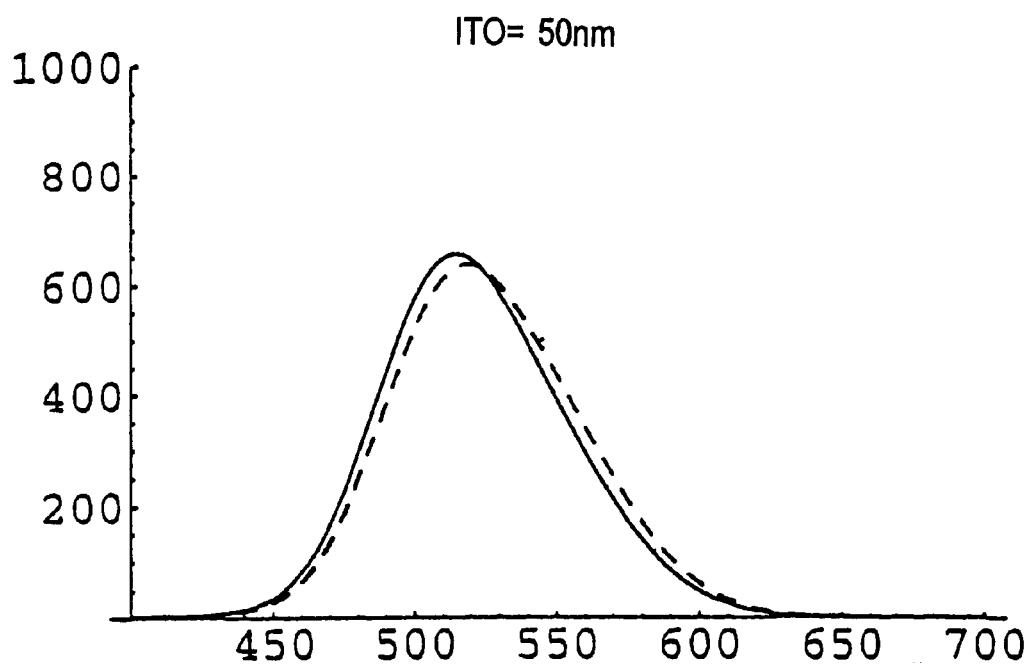
FIG. 5 is a graph showing spectra in the example and comparative example as measured at an ITO film thickness of 50 nm.
Figure 6:
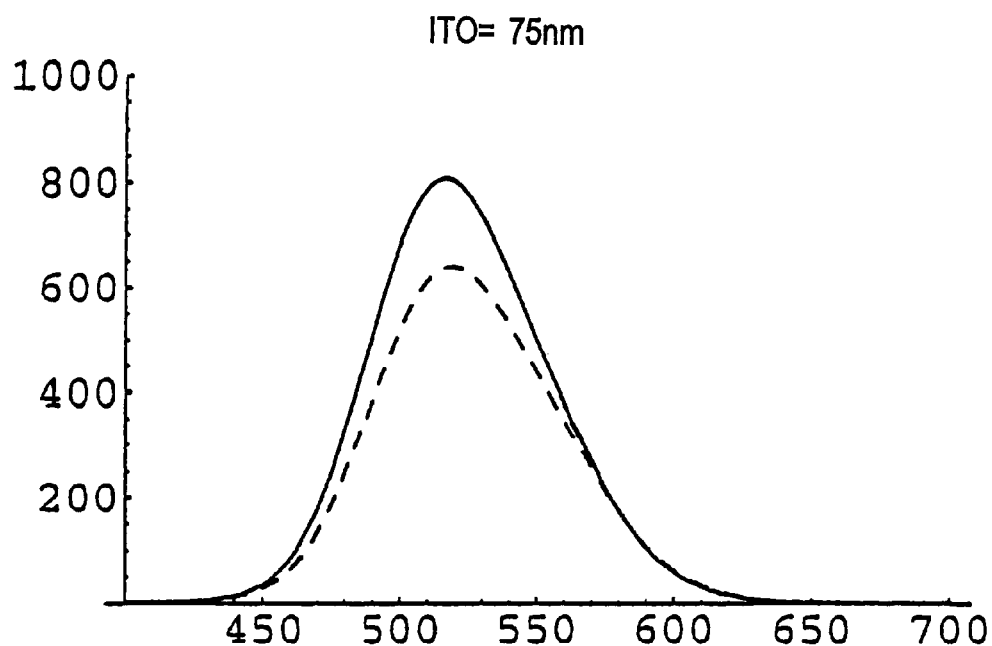
FIG. 6 is a graph showing spectra in the example and comparative example as measured at an ITO film thickness of 75 nm.
Figure 7:
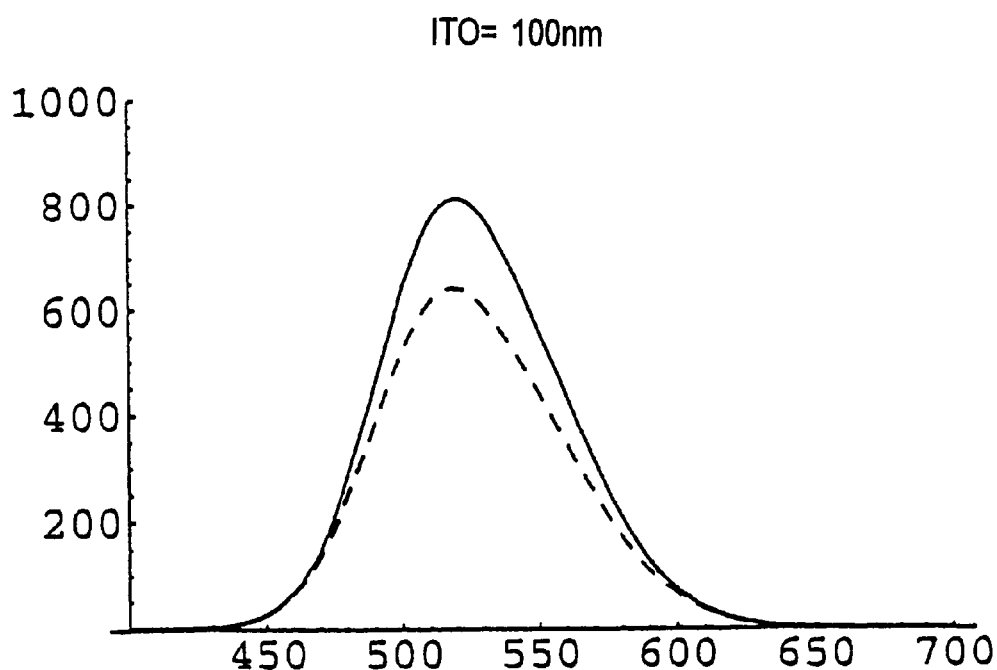
FIG. 7 is a graph showing spectra in the example and comparative example as measured at an ITO film thickness of 100 nm.
Figure 8:
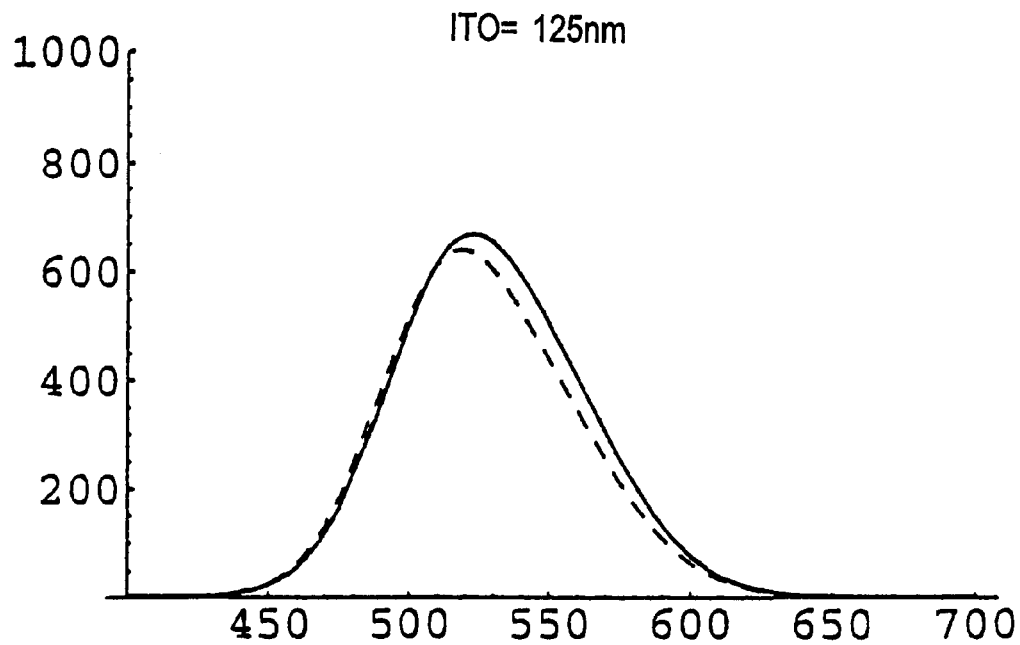
FIG. 8 is a graph showing spectra in the example and comparative example as measured at an ITO film thickness of 125 nm.
Figure 9:
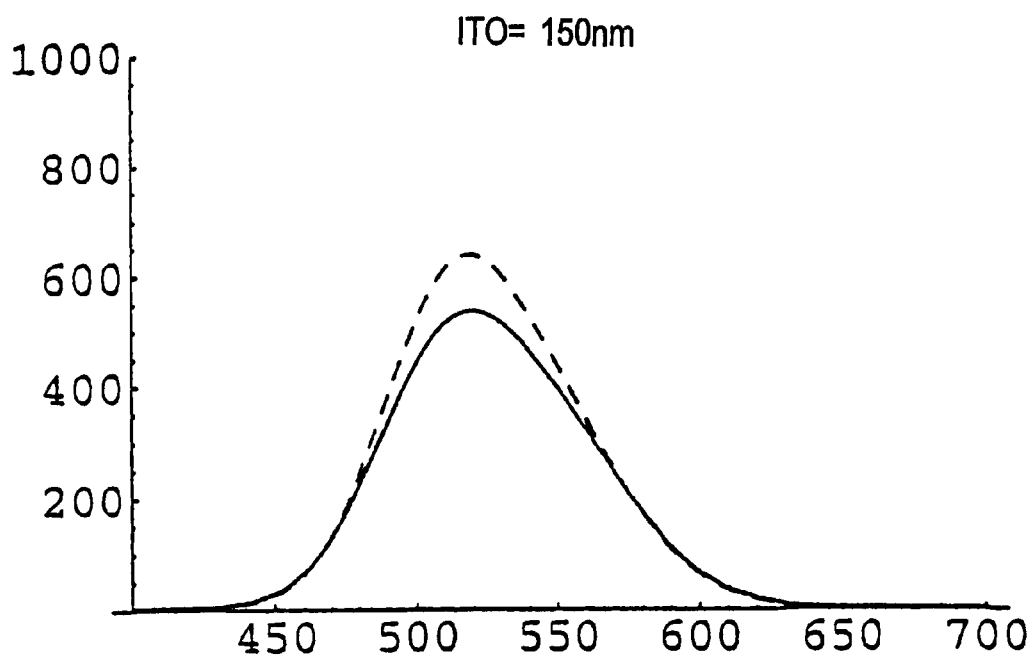
FIG. 9 is a graph showing spectra in the example and comparative example as measured at an ITO film thickness of 150 nm.
Figure 10:
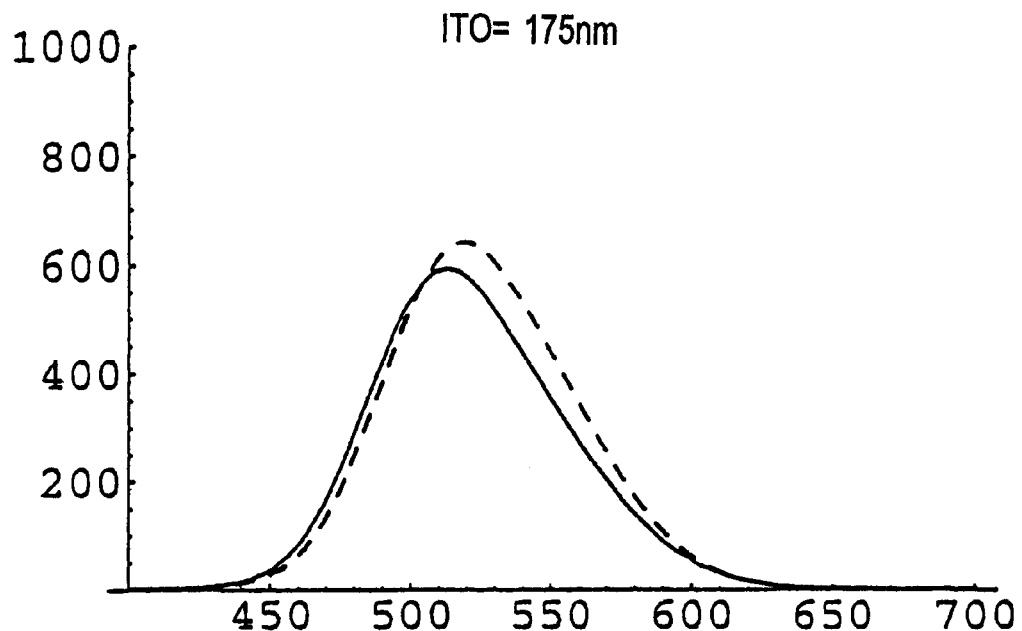
FIG. 10 is a graph showing spectra in the example and comparative example as measured at an ITO film thickness of 175 nm.
Figure 11:
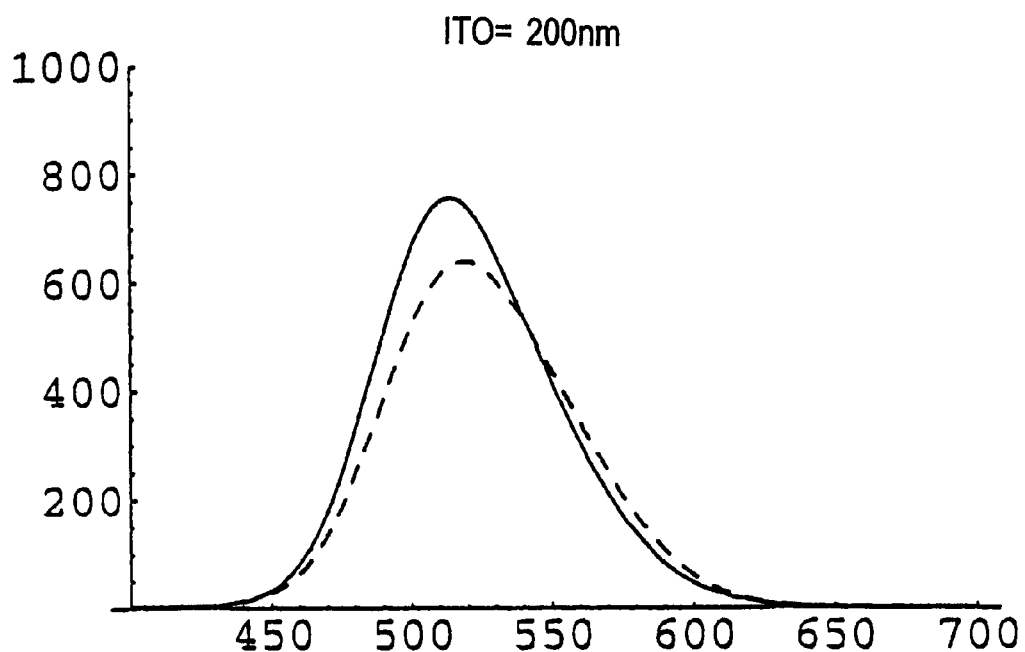
FIG. 11 is a graph showing spectra in the example and comparative example as measured at an ITO film thickness of 200 nm.
Figure 12:
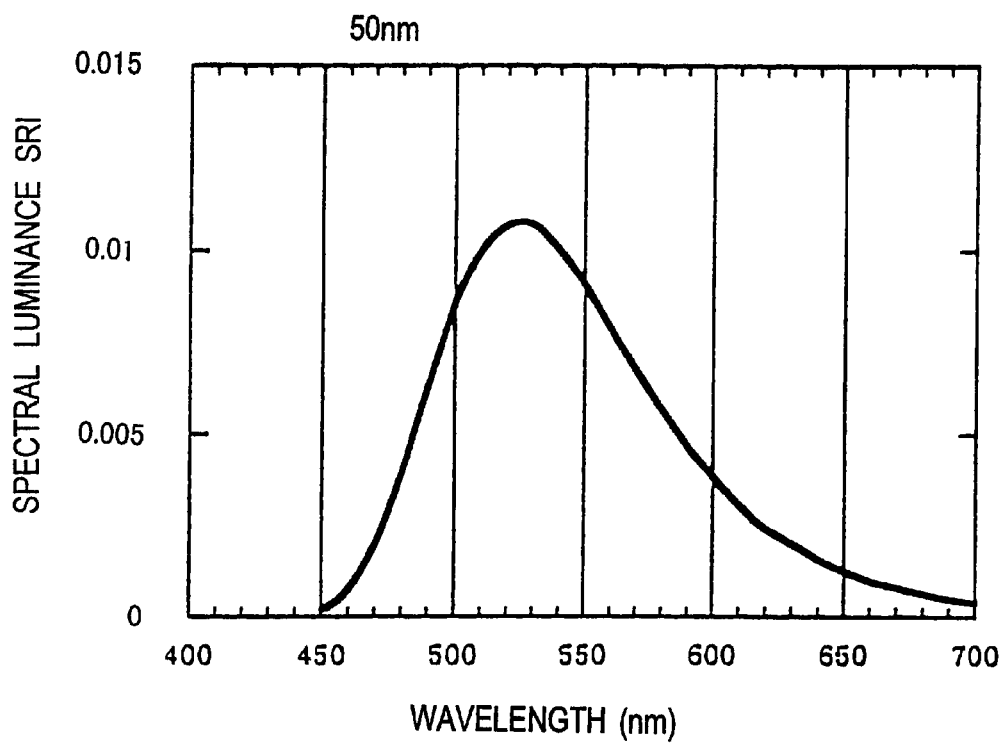
FIG. 12 is a graph showing an emission spectrum as measured at an ITO film thickness of 50 nm.
Figure 13:
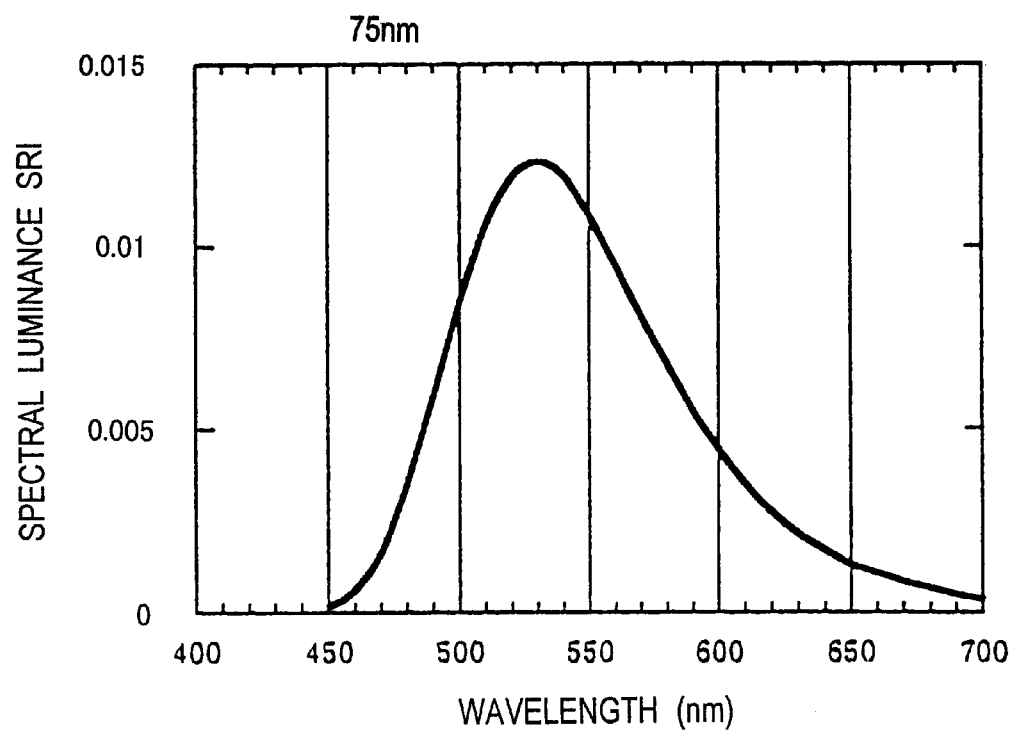
FIG. 13 is a graph showing an emission spectrum as measured at an ITO film thickness of 75 nm.
Figure 14:
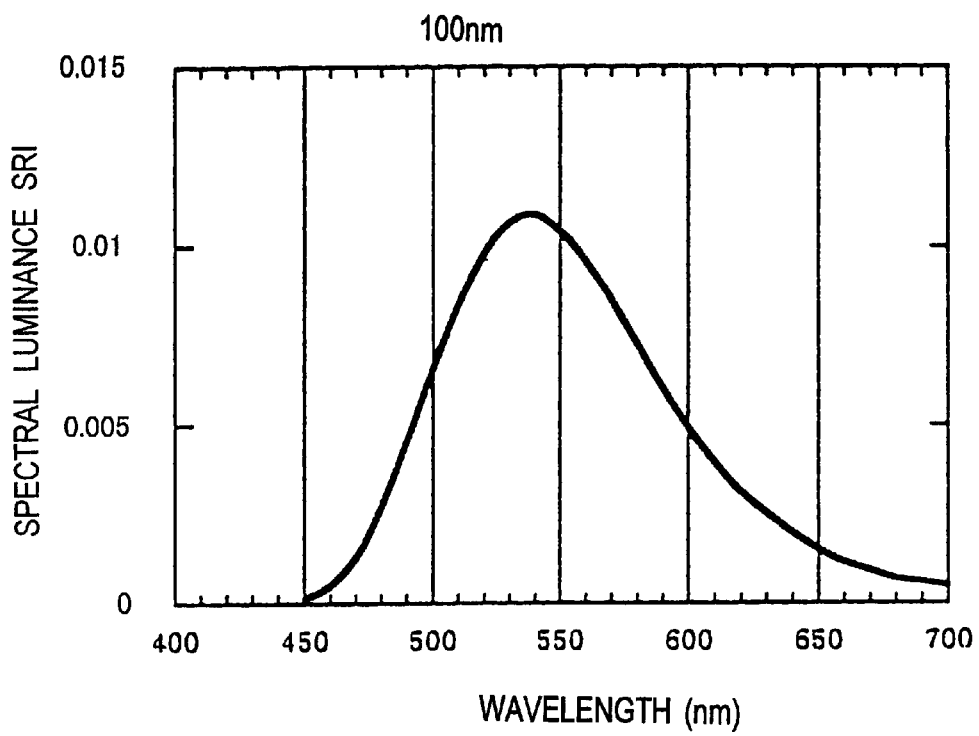
FIG. 14 is a graph showing an emission spectrum as measured at an ITO film thickness of 100 nm.
Figure 15:
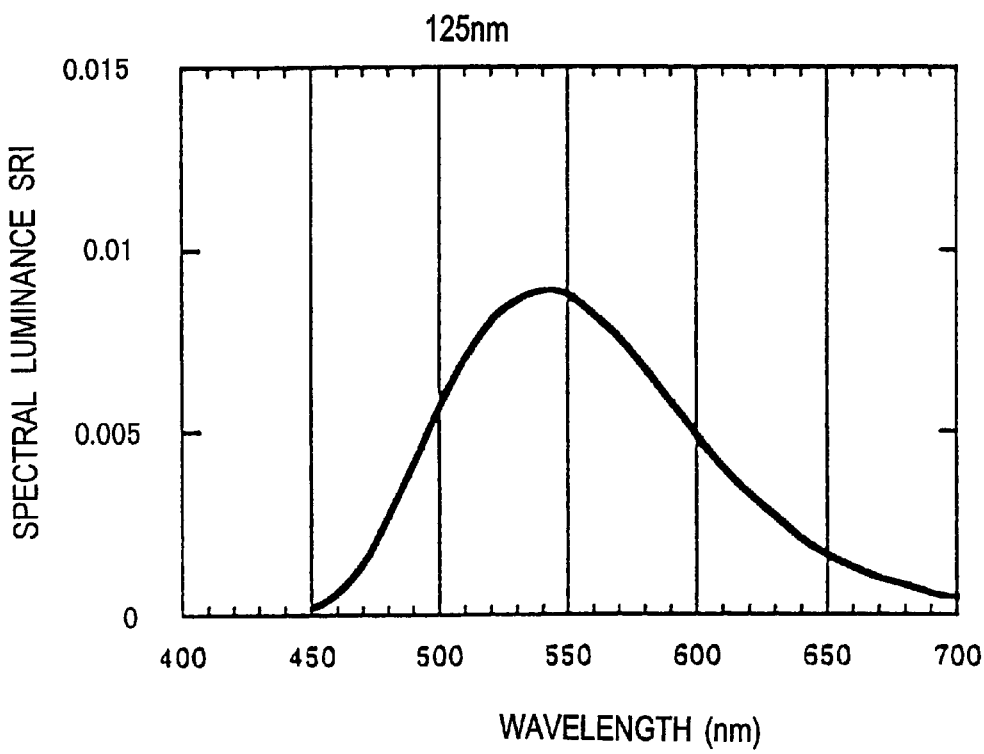
FIG. 15 is a graph showing an emission spectrum as measured at an ITO film thickness of 125 nm.
Figure 16:
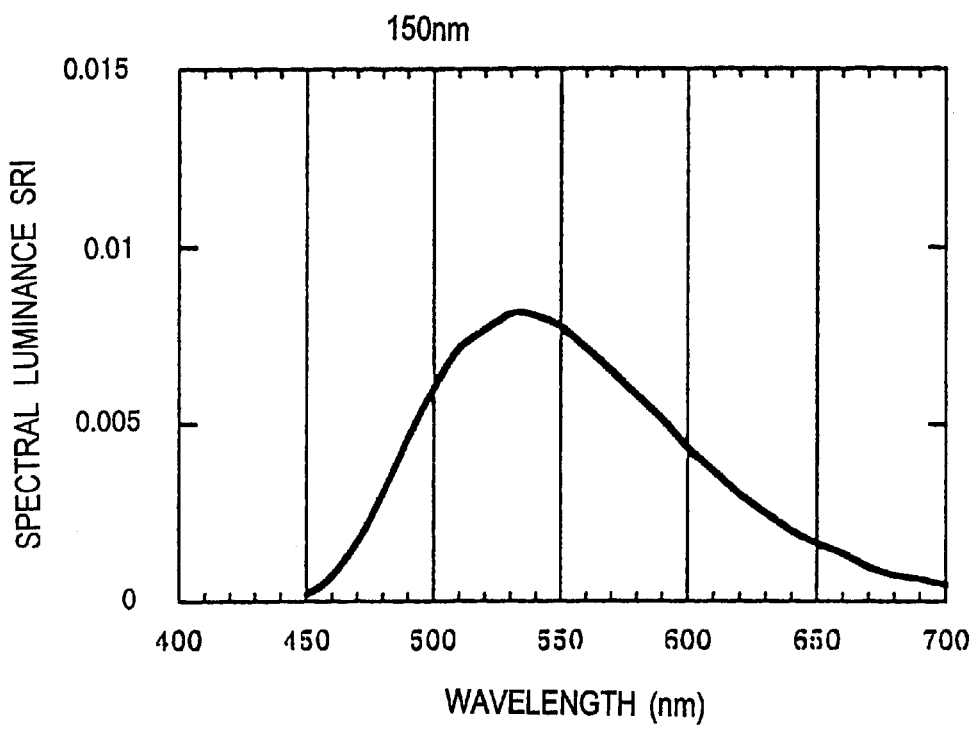
FIG. 16 is a graph showing an emission spectrum as measured at an ITO film thickness of 150 nm.
Figure 17:
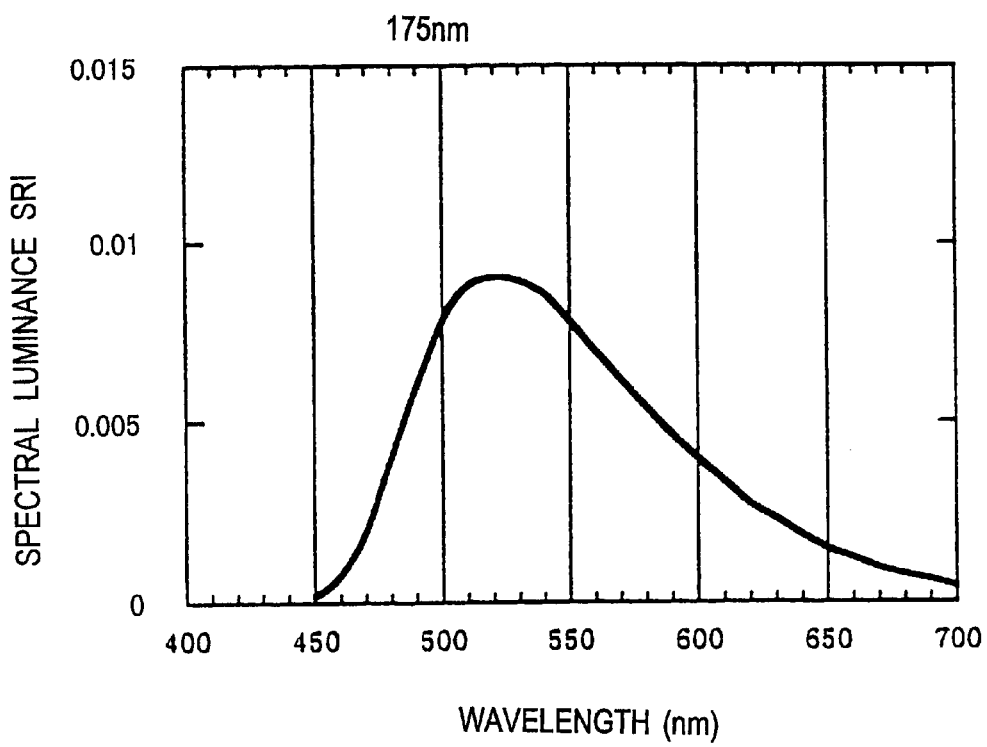
FIG. 17 is a graph showing an emission spectrum as measured at an ITO film thickness of 175 nm.
Figure 18:
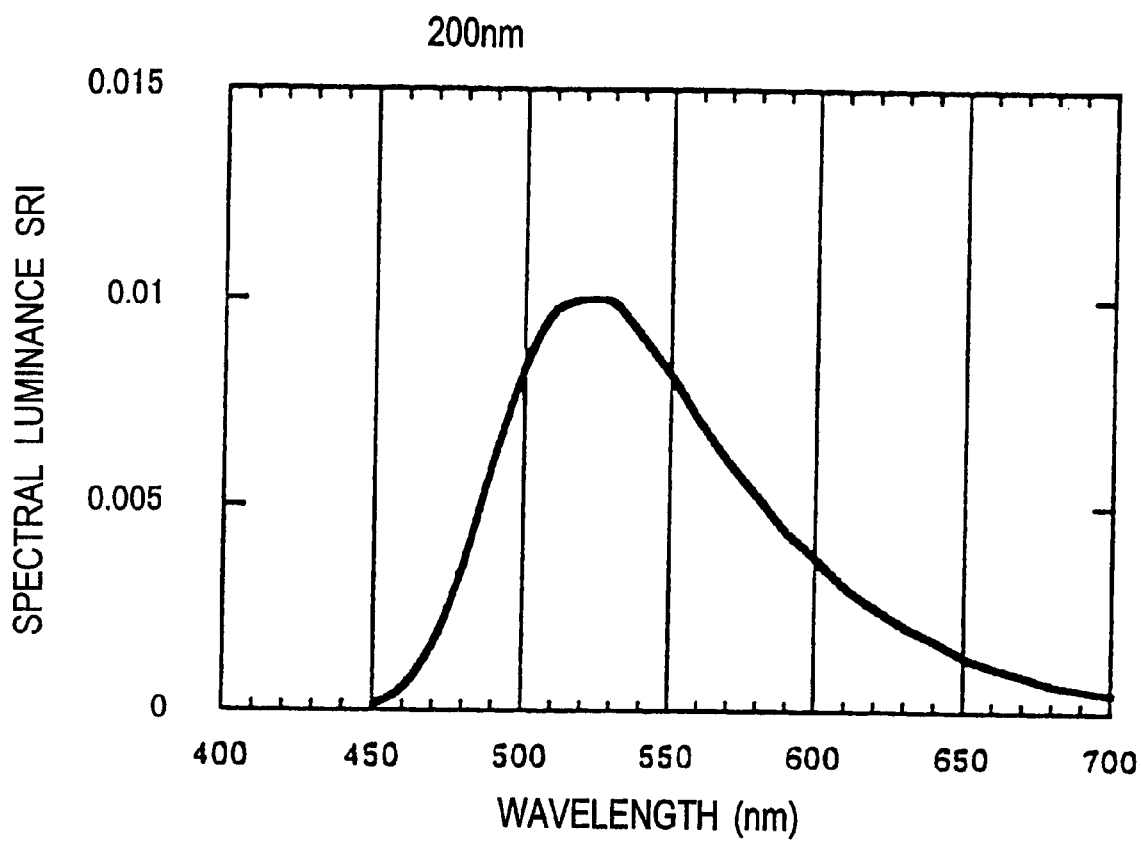
FIG. 18 is a graph showing an emission spectrum as measured at an ITO film thickness of 200 nm.

Luminous coefficient spectra: shown in FIG. 4.

Emission Spectra

Example: Model of the Invention

The simulation model of the invention is given by $\phi_a[\lambda, n1, d1, n2, d2, n3, d3, n4] =$ $\alpha_{Alq}[\lambda] \rho_a[\lambda, n1, d1, n2, d2, n3, d3, n4]$ $\rho_a[\lambda, n1, d1, n2, d2, n3, d3, n4] = \left(1 + k^2 + 2k \cos\left[2\pi\left(\frac{211[n1, d1]}{\lambda} + \frac{1}{2}\right)\right]\right)$ $\left(1 + 2r23[n2, n3]\cos\left[2\pi\left(\frac{212[n1, d1, n2, d2]}{\lambda} + \frac{1}{2}\right)\right] +\right.$ $2r34[n3, n4]\cos\left[2\pi\left(\frac{213[n1, d1, n2, d2, n3, d3]}{\lambda} + \frac{1}{2}\right)\right] +$ $2r12[n1, n2]\left(k^2 \cos\left[\frac{2\pi(211[n1, d1] + 211[n1, d1])}{\lambda}\right] +\right.$ $\left.\left.k^3 \cos\left[2\pi\left(\frac{211[n1, d1]}{\lambda} - \frac{1}{2}\right)\right]\right]\right)$ -continued $11[n1, d1] = n1 \times d1$ $12[n1, d1, n2, d2] = n1 \times d1 + n2 \times d2$ $13[n1, d1, n2, d2, n3, d3] = n1 \times d1 + n2 \times d2 + n3 \times d3$ $r12[n1, n2] = \frac{n1 - n2}{n1 + n2}$ $r23[n2, n3] = \frac{n2 - n3}{n2 + n3}$ $r34[n3, n4] = \frac{n3 - n4}{n3 + n4}$

Comparative Example: Prior Art Model

The prior art model used herein is given by $\phi_b[\lambda, n1, d1] = \alpha_{Alq}[\lambda] \rho_b[\lambda, n1, d1]$ $\rho_b[\lambda, n1, d1] = 1 + k^2 + 2k \cos\left[2\pi\left(\frac{2n1d1}{\lambda} + \frac{1}{2}\right)\right]$ An operation was performed on each simulation model, while the film thickness of the hole injecting electrode (ITO) was varied between 50 nm and 200 nm. The obtained results are plotted in FIGS. 5 to 11 wherein each broken line refers to a prior art example and each solid line refers to an example of the invention, with an arbitrary quantity as ordinate.

Control Example: Measured Model

Actually, organic EL devices. comprising the above basic arrangement with changes in the thickness d3 of the ITO electrode were prepared by vapor deposition. Using a spectral luminance meter, the emission spectra were measured of each organic EL device. The obtained results are plotted In FIGS. 12 to 18.

As can be seen from FIGS. 12 to 18, the measured models show spectral changes depending on ITO thickness, which changes are in good agreement with those on the model of the invention. Since the ITO electrode is less susceptible to electrical changes dependent on its thickness change, in principle, the changes in emission spectra manifest itself as an effect of optical modulation.

Emission Luminance

Example: Model of the Invention

The simulation mode of the invention is given by $\eta_a[n1,d1,n2,d2,n3,d3,n4]=\int_{300}^{800}\phi_a[\lambda,n_1,d_1,n_2,d_2,n_3,d_3,n_4]\cdot\theta_{(\lambda)}d\lambda$

Comparative Example: Prior Art Model

Figure 19:
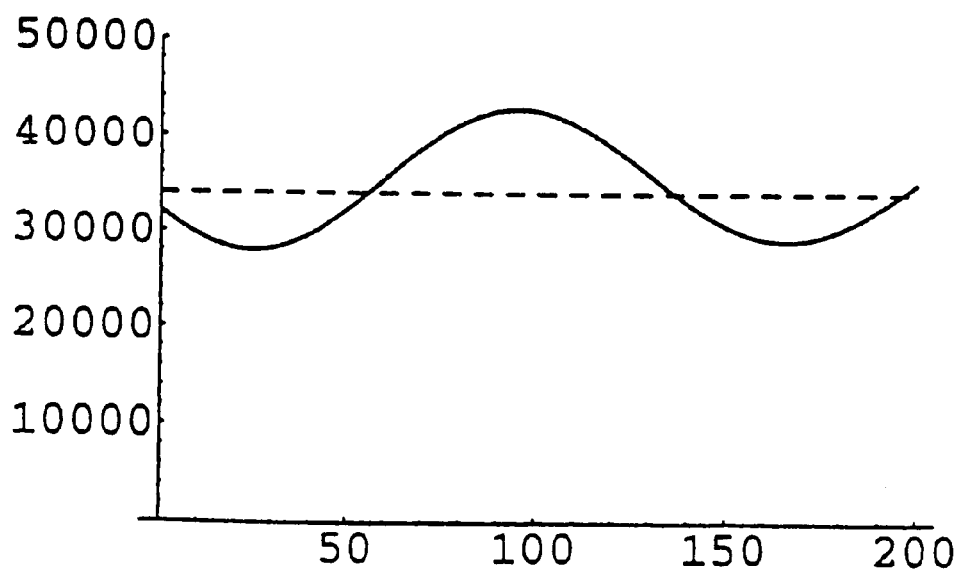
FIG. 19 is a graph showing emission luminance in the example and comparative example as measured at an ITO film thickness varied between 0 nm and 200 nm.
Figure 20:
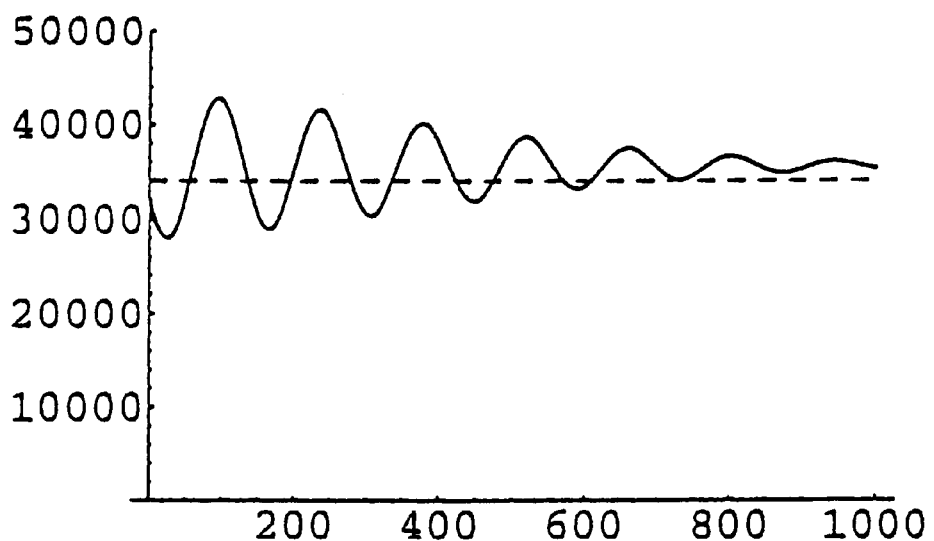
FIG. 20 is a graph showing emission luminance in the example and comparative example as measured at an ITO film thickness varied between 0 nm and 1,000 nm.

A prior simulation art model is given by $\eta_b[n1,d1]=\int_{300}^{800}\phi_b(\lambda,n_1,d_1)\cdot\theta_{(\lambda)}d\lambda$ An operation was performed on each simulation model, while the film thickness of the hole injecting electrode (ITO) was varied between 50 nm and 200 nm, and between 0 nm and 1,000 nm. The obtained results are plotted in FIGS. 19 and 20 wherein each broken line refers to a prior art example and each solid line refers to an example of the invention.

Control Example: Measured Model

Actually, organic EL devices comprising the above basic arrangement with changes in the thickness d3 of the ITO electrode were prepared by vapor deposition. Using a spectral luminance meter, the light emission luminance was measured of each organic EL device. The obtained results are plotted in FIG. 21.

Figure 21:
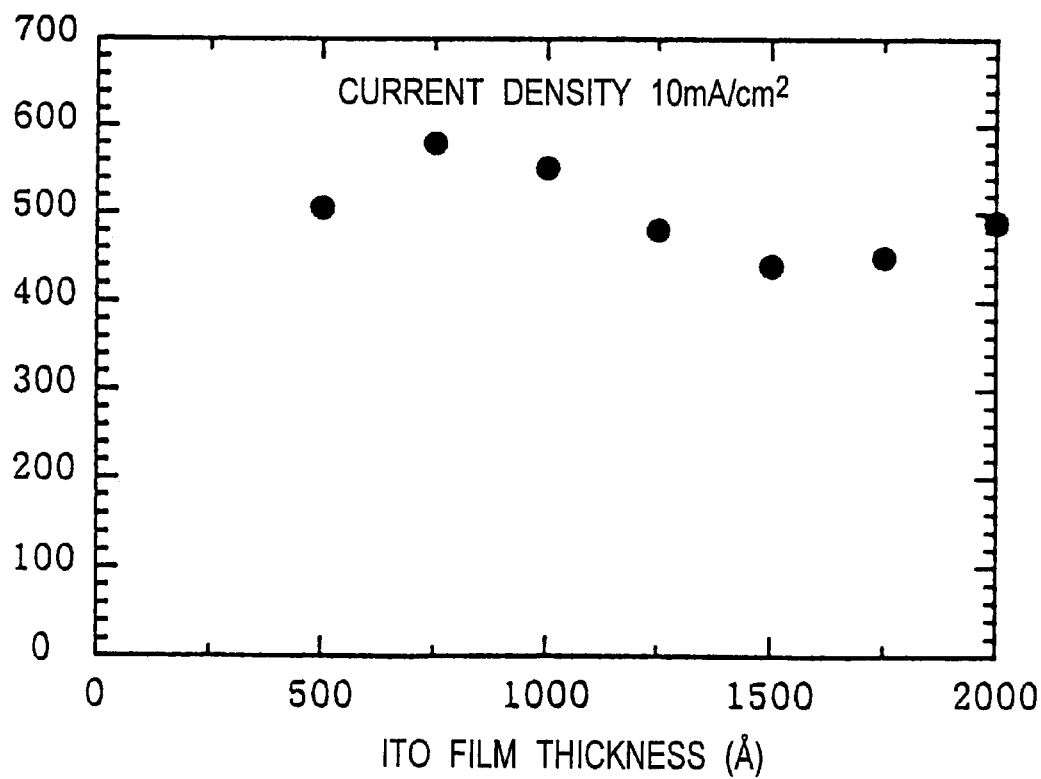
FIG. 21 is a graph showing emission luminance as measured at an ITO film thickness varied between 50 nm and 200 nm.

As can be seen from FIG. 21, the measured model shows luminance changes depending on ITO thickness, which changes are in good agreement with those on the model of the invention. Since the ITO electrode is less susceptible to electrical changes dependent on its thickness change, in principle, the changes in light emission luminance manifest themselves as an effect of optical modulation.

From a comparison of these simulation models with the measured values, it is found that the model of the invention is much more accurate than the prior art model. It is then possible to run an accurate simulation by taking light reflected at surfaces other than the metal surface into quantitative consideration. When the emission spectra of the organic EL device is optically modulated, it is thus possible to determine an optical device arrangement capable of achieving modulation as desired. However, the simple approximate expression so far used in the art is susceptible to errors due to the modulation of emission spectra by light reflected at surfaces other than the metal surface, because such modulation is still neglected. Only by use of conventional qualitative analysis, it is impossible to make any quantitative estimation of spectral changes. In addition, such qualitative analysis cannot be applied to cases where various wavelengths exist as in white light.

While, in the above examples, some simple arrangements of the organic EL device using $Alq^3$ were simulated, it is to be understood that the simulation model of the invention is applicable to other systems. Light emitting points were investigated assuming that they were localized light emission. For the case where the light emitting points have some distribution (with the proviso that there is no correlation among different light emitting areas), however, only the integration of contributions from the respective minute light emitting areas is needed. The subsequent sequence is much the same as mentioned above.

Next, a detailed account is given of the points clarified by this simulation.

Luminance changes depending on the film thickness d3 of the hole injecting electrode, and converges gradually. This is because there is a large refractive index difference between n3 and n4, and indicates that reflection at the interface between the hole injecting electrode and the glass substrate prevails. When, for instance, large reflection occurs at other interface, however, it can be easily estimated that the luminance is also dependent on its optical distance.

The above simulation is not limited to such arrangements as mentioned above; it is also applicable to a device comprising, for instance, a substrate, an electron injecting electrode, an organic layer, a transparent electrode and an optical layer.

From the above results, it is now found that a specific relation between the optical arrangement and light emission properties of an organic EL device can be calculated. Consequently, it is possible to have a knowledge of a specific relation between variations in the optical properties and variations in the optical film thickness. By use of the above simulation model, it is possible to find out the value demanded for the film thickness variations in the device arrangement, thereby obtaining the desired optical variation.

For instance, consider one of the above arrangements where d3=100 nm (ITO film thickness). It is found that in order to confine the luminance variation within the range of ±5%, the film thickness variation must be confined within the range of ±20%. Where d3=70 nm or d3=200 nm, it is found that in order to confine the luminance variation within the range of ±5%, the film thickness variation must be confined within the range of ±10%. It is thus found that the smaller the film thickness, the more favorable the results become, as can seen from the film thickness variation that is ±13% at d3=70 nm, and ±5% at d3=200 nm. Generally, a variation in the film thickness obtained with a film-forming system is of the order of ±5%. Preferably in this case, therefore, the hole injecting electrode is used at d3=70 nm. It is thus found that in order to confine the luminance variation within the range of ±5%, the total optical film thickness of the ITO transparent electrode and the organic layer must be reduced to 1.9×20 nm or lower.

The above calculation is only one example. Thus, the obtained values vary with a change in the thickness of other film. In general, the smaller the film thickness, the smaller the absolute value of the film thickness variation is. In other words, the decrease in the film thickness is an important factor for variation reductions.

The above simulation and its feedback may also be extended to a system made up of different materials or comprising different optical systems by formulating a model corresponding thereto and performing an operation. The arrangement having an ITO transparent conductive film/organic layer formed on a glass substrate has been analyzed as an example. However, an arrangement comprising a glass substrate, a buffer layer Nr formed on the substrate by coating polyimide, resist or the like thereon, and an ITO transparent conductive film/organic layer/electron injecting electrode, too, may be analyzed in terms of luminance variations.

Generally, the buffer layer Nr and transparent conductive film have a close refractive index of about 1.8 to 2.0, while glass has a refractive index of about 1.5. Consequently, light reflected at an interface between the glass and the buffer layer Nr gives rise to modulation. For reducing a luminance variation, a thickness variation of the buffer layer Nr becomes an important factor, and so it must be confined accurately within several tens of nanometers. However, this is very difficult for general resist or polyimide, materials. From the results of analyses herein mentioned, it is now found that the luminance change by modulation converges with increasing d3. In this case, it is thus understood that satisfactory results are obtained even when the thickness of the buffer layer Nr is increased to a sufficient level. From the above results of simulations, it is then understood that if the thickness of the buffer layer Nr is at least 700 nm, satisfactory results are obtainable. To confine the luminance variation within ±5%, it is also understood that the total of optical thicknesses of the IT transparent electrode, buffer layer and organic layer should be limited to at most 1.9×200 nm.

As can be understood from the foregoing, the present invention provides a simulation method and system for simulating an organic EL device, which, by making approximations to reflected light components other than reflected light with consideration given so far thereto, can make an accurate estimation of spectra emitted out of an organic EL device having a general and arbitrary structure, thereby enabling a device design for obtaining the desired spectra.

The present invention also provides a simulation method and system for simulating an organic EL device, which enable light to be efficiently taken out of even a structure comprising many reflective surfaces.

Further, the present invention provides a simulation method and system for simulating an organic EL device, by which a device arrangement capable of reducing optical variations is achievable.

Furthermore, the present invention provides an organic EL device which, on the basis of the results of simulations, is such designed as to reduce optical variations.

Japanese Patent Application No. 363196/1987 is herein incorporated by reference.

Although some preferred embodiments have been described, many modifications and variations may be made thereto in the light of the above teachings. It is therefore to be understood that within the scope of the appended claims, the invention may be practiced otherwise than as specifically described.

What we claim is:

1. A simulation method utilizing a simulation model from which emission spectra of an organic EL device are obtained, the organic EL device comprising a q-species layer located on a metal surface side of a light emitting source, and a p-species layer located on a side facing away from said metal surface side and having a refractive index different from that of said q-species layer, wherein said simulation model comprises the steps of:

calculating a total composite wave $\Phi[\lambda]$ composed of waves $\Phi nm$ reflected at interfaces of the organic EL device given by $$\Phi[\lambda] = \Phi_1 + \sum_{t=1}^{p-1} \Phi_{t,t+1} + \sum_{t=1}^{q-1} \Phi_{\bar{t},\overline{t+1}} + \sum_{t=1}^{q} \Phi_{\bar{t},\overline{t-1}}$$

wherein $\lambda$ is a wavelength, $\Phi nm$ is a reflected wave upon incidence from an n-layer on an m-layer, p>1, and q>1, and the p-layer is made of a glass or atmosphere;

calculating a composite wave $\Phi_1$, which is encompassed in the total composite wave $\Phi[\lambda]$ and is composed of a light component emitted in a first direction from the light emitting source and then emitted out without reflection at an interface, and a light component emitted in a second direction from the light emitting source, reflected in the first direction at the metal surface and then emitted out without reflection at another interface, given by $$\Phi_1 = \Phi_0 + \Phi_{\bar{0}}$$

$$\Phi_{\bar{0}} = r_{q,m}\Phi_0 \exp\left[2\pi i\left(\frac{2L_{\bar{1q}}}{\lambda}\right)\right]$$

$$L_{\bar{1q}} = \sum_{t=1}^{q} \Delta_{\bar{t}}$$

$$r_{qm} = -k$$

$$\Delta_{\bar{t}} = d_{\bar{t}} n_{\bar{t}}$$

wherein nm is a refractive index of the m-layer, $\Delta m$ is an optical path length of the m-layer, rmn is an amplitude reflectance upon incidence of a light wave from the m-layer on the n-layer, $\Phi$ is an amplitude of the light wave, $\rho$ is a square of the amplitude of the light wave, L is an optical path length, $\lambda$ is a wavelength, d is a film thickness, and n is a refractive index;

calculating a light component, which is encompassed in the total composite wave $\Phi[\lambda]$, and is emitted in the first direction from the light emitting source, reflected at a t-th layer interface, reflected in the first direction at the metal surface and then emitted out without reflection at the another interface, given by $$\Phi_{t,t+1} = r_{t,t+1} r_{q,m} \Phi_1 \exp\left[2\pi i\left(\frac{2L_{t,q}}{\lambda}\right)\right]$$

$$L_{t,q} = \sum_{j=1}^{q} \Delta_{\bar{j}} + \sum_{j=1}^{t} \Delta_j$$

$$r_{t,t+1} = \frac{n_t - n_{t+1}}{n_t + n_{t+1}}$$

$$\Delta_{\bar{t}} = d_{\bar{t}} n_{\bar{t}}$$

$$\Delta_t = d_t n_t$$

calculating a light component, which is encompassed in the total composite wave $\Phi[\lambda]$, and is emitted in the second direction from the light emitting source, reflected in the first direction at the t-th layer interface and then emitted out without reflection at the another interface, given by $$\Phi_{\bar{t},\overline{t+1}} = r_{\bar{t},\overline{t+1}} \Phi_0 \exp\left[2\pi i\left(\frac{2L_{\bar{t},\bar{t}}}{\lambda}\right)\right]$$

$$L_{\bar{T},\bar{t}} = \sum_{j=1}^{t} \Delta_{\bar{j}}$$

$$r_{\bar{t},\overline{t+1}} = \frac{n_{\bar{t}} - n_{\overline{t+1}}}{n_{\bar{t}} + n_{\overline{t+1}}}$$

calculating a light component, which is encompassed in the total composite wave $\Phi[\lambda]$, and is emitted in the second direction from the light emitting source, reflected in the first direction at the metal surface, reflected at the t-th layer interface, reflected in the first direction at the metal surface and then emitted out without reflection at the another interface, given by $$\Phi_{\bar{t},\overline{t-1}} = r_{\bar{t},\overline{t-1}} \Phi_0 r_{qm} \exp\left[2\pi i\left(\frac{2L_{\bar{t},q}}{\lambda}\right)\right]$$

$$L_{\bar{t},q} = \sum_{j=1}^{q} \Delta_{\bar{j}}$$

$$r_{\bar{t},\overline{t-1}} = \frac{n_{\bar{t}} - n_{\overline{t-1}}}{n_{\bar{t}} + n_{\overline{t-1}}}$$

$$\Phi_{\bar{T}\,\bar{0}} = \Phi_{\bar{T}\,1}$$

$$\Phi_{\bar{T}\,1} = r_{\bar{T}\,1} \Phi_0 r_{qm} \exp\left[2\pi i\left(\frac{2L_{\bar{T},q}}{\lambda}\right)\right]$$

$$r_{\bar{T}\,1} = \frac{n_{\bar{T}} - n_1}{n_{\bar{T}} + n_1}$$

calculating a modulated spectrum $\rho[\lambda]$ obtained from a composite wave of said light components given by $$\rho[\lambda] = \Phi[\lambda]\Phi[\lambda]^*$$

$$\frac{\rho[\lambda]}{\Phi_0 \Phi_0^*} = \rho_1[\lambda] + \rho_2[\lambda] + \rho_3[\lambda] + \rho_4[\lambda]$$

$$\rho_1[\lambda] = \left(1 + k^2 + 2k\cos\left[2\pi\left(\frac{2L_{\bar{T},q}}{\lambda} + \frac{1}{2}\right)\right]\right)$$

$$\rho_2[\lambda] = \rho_1[\lambda] \sum_{t=1}^{p-1} 2r_{t,t+1} \cos\left[2\pi\left(\frac{2L_{t,q}}{\lambda} + \frac{1}{2}\right)\right]$$

-continued $$\rho_3[\lambda] = \sum_{t=1}^{q-1} 2r_{\bar{t},\overline{t+1}}\left(\cos\left[2\pi\frac{2L_{T,\bar{t}}}{\lambda}\right] + k\cos\left[2\pi\left(\frac{2L_{T,q}+2L_{T,\bar{t}}}{\lambda}+\frac{1}{2}\right)\right]\right)$$

$$\rho_4[\lambda] = \sum_{t=1}^{q} 2r_{\bar{t},\overline{t+1}}$$
$$\left(k^2\cos\left[2\pi\frac{2L_{T,q}+2L_{T,q}}{\lambda}\right] + k^3\cos\left[2\pi\left(\frac{2L_{T,\bar{q}}}{\lambda}-\frac{1}{2}\right)\right]\right)$$

where $-k$ is an amplitude reflectance at the metal surface and * is a complex number, and calculating a spectrum $I_{EL}[\lambda]$ subjected to optical modulation and emitted out through the p-layer given by $$I_{EL}[\lambda] = I_{PL}[\lambda]\rho[\lambda]$$

where $I_{PL}[\lambda]$ is a spectrum of the light emitting source.

2. The simulation method according to claim 1, wherein said simulation model further comprising the step of calculating emission luminance given by $$L = \int_o^\infty I_{EL}[\lambda]\,\theta[\lambda]d\lambda$$

where $\theta[\lambda]$ is a luminous coefficient.

3. The simulation method according to claim 1, wherein said simulation model further comprising the steps of:

calculating an interference spectrum given by $$\Gamma[\lambda] = \int_o^{de}\rho[x,\lambda]\,\phi[x]dx$$

where de is a constant thickness of the light emitting layer, $\eta[x]$ is a quantity of recombination at a point x that is an arbitrary point in the light emitting layer, $\rho[x,\lambda]$ is an intensity due to interference, and the quantity of recombination $\eta[x]$ is substituted by an emission intensity distribution $\phi[x]$, calculating a spectrum $I_{EL}[\lambda]$ emitted from said interference spectrum given by $$I_{EL}[\lambda] = I_{PL}[\lambda]\Gamma[\lambda]$$

and calculating luminance L given by $$L = \int_o^\infty I_{EL}[\lambda]\,\theta[\lambda]d\lambda.$$

4. A simulation system including a simulation model from which emission spectra of an organic EL device are obtained, the organic EL device comprising a q-species layer located on a metal surface side of a light emitting source, and a p-species layer located on a side facing away from said metal surface side and having a refractive index different from that of said q-species layer, said simulation model comprises:

calculating a total composite wave $\Phi[\lambda]$ composed of waves $\Phi$nm reflected at interfaces given by $$\Phi[\lambda] = \Phi_1 + \sum_{t=1}^{p-1}\Phi_{t',t+1} + \sum_{t=1}^{q-1}\Phi_{\overline{t'},\overline{t+1}} + \sum_{t=1}^{q}\Phi_{\overline{t'},\overline{t-1}}$$

wherein $\lambda$ is a wavelength, $\Phi$nm is a reflected wave upon incidence from an n-layer on an m-layer, p>1, and q≧1, and the player is made of a glass or atmosphere;

calculating a composite wave $\Phi_1$, which is encompassed in the total composite wave $\Phi[\lambda]$ and is composed of a light component emitted in a first direction from the light emitting source and then emitted out without reflection at an interface, and a light component emitted in a second direction from the light emitting source, reflected in the first direction at the metal surface and then emitted out without reflection at another interface, is given by $$\Phi_1 = \Phi_0 + \Phi_{\bar{0}}$$
$$\Phi_{\bar{0}} = r_{q,m}\Phi_0\,\exp\left[2\pi i\left(\frac{2L_{\overline{Tq}}}{\lambda}\right)\right]$$
$$L_{\overline{Tq}} = \sum_{t=1}^{q}\Delta_{\bar{t}}$$
$$r_{\overline{qm}} = -k$$
$$\Delta_{\bar{t}} = d_{\bar{t}}n_{\bar{t}}$$

wherein nm is a refractive index of the m-layer, $\Delta$m is an optical path length of the m-layer, rmn is an amplitude reflectance upon incidence of a light wave from the m-layer on the n-layer, $\Phi$ is an amplitude of the light wave, $\rho$ is a square of the amplitude of the light wave, L is an optical path length, $\lambda$ is a wavelength, d is a film thickness, and n is a refractive index;

calculating a light component, which is encompassed in the total composite wave $\Phi[\lambda]$, and is emitted in the first direction from the light emitting source, reflected at a t-th layer interface, reflected in the first direction at the metal surface and then emitted out without reflection at the another interface, given by $$\Phi_{t,t+1} = r_{t,t+1}r_{q,m}\Phi_1\,\exp\left[2\pi i\left(\frac{2L_{t,q}}{\lambda}\right)\right]$$
$$L_{t,q} = \sum_{j=1}^{q}\Delta_j + \sum_{j=1}^{t}\Delta_j$$
$$r_{t,t+1} = \frac{n_t - n_{t+1}}{n_t + n_{t+1}}$$
$$\Delta_{\bar{t}} = d_{\bar{t}}n_{\bar{t}}$$
$$\Delta_t = d_tn_t$$

calculating a light component, which is encompassed in the total composite wave $\Phi[\lambda]$, and is emitted in the second direction from the light emitting source, reflected in the first direction at the t-th layer interface and then emitted out without reflection at the another interface, given by $$\Phi_{\bar{t},\overline{t+1}} = r_{\bar{t},\overline{t+1}}\Phi_0\,\exp\left[2\pi i\left(\frac{2L_{T,\bar{t}}}{\lambda}\right)\right]$$

$$L_{T,\bar{t}} = \sum_{j=1}^{\bar{t}} \Delta_j$$

$$r_{\bar{t},\overline{t+1}} = \frac{n_{\bar{t}} - n_{\overline{t+1}}}{n_{\bar{t}} + n_{\overline{t+1}}}$$

calculating a light component, which is encompassed in the total composite wave $\Phi[\lambda]$, and is emitted in the second direction from the light emitting source, reflected in the first direction at the metal surface, reflected at the t-th layer interface, reflected in the first direction at the metal surface and then emitted out without reflection at the another interface, given by $$\Phi_{\bar{t},\overline{t-1}} = r_{\bar{t},\overline{t-1}} \Phi_0 r_{qm} \exp\left[2\pi i\left(\frac{2L_{\bar{t},q}}{\lambda}\right)\right]$$

$$L_{\bar{t},q} = \sum_{j=1}^{q} \Delta_j$$

$$r_{\bar{t},\overline{t-1}} = \frac{n_{\bar{t}} - n_{\overline{t-1}}}{n_{\bar{t}} + n_{\overline{t-1}}}$$

$$\Phi_{T\bar{0}} = \Phi_{T1}$$

$$\Phi_{T1} = r_{T1}\Phi_0 r_{qm} \exp\left[2\pi i\left(\frac{2L_{T,q}}{\lambda}\right)\right]$$

$$r_{T1} = \frac{n_T - n_1}{n_T + n_1}$$

calculating a modulated spectrum $\rho[\lambda]$ obtained from a composite wave of said light components given by $$\rho[\lambda] = \Phi[\lambda]\Phi[\lambda]^*$$

$$\frac{\rho[\lambda]}{\Phi_0 \Phi_0^*} = \rho_1[\lambda] + \rho_2[\lambda] + \rho_3[\lambda] + \rho_4[\lambda]$$

$$\rho_1[\lambda] = \left(1 + k^2 + 2k\cos\left[2\pi\left(\frac{2L_{T,q}}{\lambda} + \frac{1}{2}\right)\right]\right)$$

$$\rho_2[\lambda] = \rho_1[\lambda] \sum_{t=1}^{p-1} 2r_{t,t+1} \cos\left[2\pi\left(\frac{2L_{t,q}}{\lambda} + \frac{1}{2}\right)\right]$$

$$\rho_3[\lambda] = \sum_{t=1}^{q-1} 2r_{\bar{t},\overline{t+1}} \left(\cos\left[2\pi\frac{2L_{T,\bar{t}}}{\lambda}\right] + k\cos\left[2\pi\left(\frac{2L_{T,q} + 2L_{T,\bar{t}}}{\lambda} + \frac{1}{2}\right)\right]\right)$$

$$\rho_4[\lambda] = \sum_{t=1}^{q} 2r_{\bar{t},\overline{t+1}}$$

$$\left(k^2\cos\left[2\pi\frac{2L_{T,q} + 2L_{\bar{t},q}}{\lambda}\right] + k^3\cos\left[2\pi\left(\frac{2L_{\bar{t},q}}{\lambda} - \frac{1}{2}\right)\right]\right)$$

where $-k$ is an amplitude reflectance at the metal surface and * is a complex number; and calculating a spectrum $I_{EL}[\lambda]$ subjected to optical modulation and emitted out through the player given by $$I_{EL}[\lambda] = I_{PL}[\lambda]\rho[\lambda]$$

where $I_{PL}[\lambda]$ is a spectrum of the light emitting source.

5. The simulation system according to claim 4, wherein said simulation model further comprising calculating an emission luminance given by $$L = \int_0^\infty I_{EL}[\lambda] \theta[\lambda] d\lambda$$

where $\theta[\lambda]$ is a luminous coefficient.

6. The simulation system according to claim 4, wherein said simulation model further comprising:

calculating an interference spectrum given by $$\Gamma[\lambda] = \int_0^{de} \rho[x,\lambda] \phi[x] dx$$

where de is a constant thickness of the light emitting layer, $\eta[x]$ is a quantity of recombination at a point x that is an arbitrary point in the light emitting layer, $\rho[x,\lambda]$ is an intensity due to interference, and the quantity of recombination $\eta[x]$ is substituted by an emission intensity distribution $\phi[x]$, calculating a spectrum $I_{EL}[\lambda]$ emitted from said interference spectrum given by $$I_{EL}[\lambda] = I_{PL}[\lambda]\Gamma[\lambda]$$

and calculating luminance L given by $$L = \int_0^\infty I_{EL}[\lambda] \theta[\lambda] d\lambda.$$

* * * * *

UNITED STATES PATENT AND TRADEMARK OFFICE
CERTIFICATE OF CORRECTION

PATENT NO. : 6,327,554 B1
DATED : December 4, 2001
INVENTOR(S) : Isamu Kobori

It is certified that error appears in the above-identified patent and that said Letters Patent is hereby corrected as shown below:

<u>Column 25,</u>
Line 33, change "q>1" to -- q≥1 --.

<u>Column 28,</u>
Line 9, change "player" to -- p-layer --.

Signed and Sealed this

Twenty-seventh Day of August, 2002

Attest:

JAMES E. ROGAN
Attesting Officer
Director of the United States Patent and Trademark Office